(12) United States Patent
Choi

(10) Patent No.: US 12,027,471 B2
(45) Date of Patent: Jul. 2, 2024

(54) SEMICONDUCTOR PACKAGE HAVING STIFFENER STRUCTURE

(71) Applicant: Samsung Electronics Co., Ltd., Suwon-si (KR)

(72) Inventor: Eunkyoung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 17/576,113

(22) Filed: Jan. 14, 2022

(65) Prior Publication Data

US 2022/0399287 A1    Dec. 15, 2022

(30) Foreign Application Priority Data

Jun. 10, 2021   (KR) .................. 10-2021-0075640

(51) Int. Cl.
| | |
|---|---|
| *H01L 21/768* | (2006.01) |
| *H01L 21/48* | (2006.01) |
| *H01L 21/56* | (2006.01) |
| *H01L 21/66* | (2006.01) |
| *H01L 21/68* | (2006.01) |
| *H01L 23/00* | (2006.01) |
| *H01L 23/31* | (2006.01) |

(Continued)

(52) U.S. Cl.
CPC ...... *H01L 23/562* (2013.01); *H01L 23/49816* (2013.01); *H01L 23/49833* (2013.01); *H01L 23/49838* (2013.01); *H01L 25/0652* (2013.01); *H01L 2225/06513* (2013.01); *H01L 2225/06517* (2013.01); *H01L 2225/0652* (2013.01); *H01L 2225/06541* (2013.01); *H01L 2225/06548* (2013.01); *H01L 2225/06582* (2013.01); *H01L 2225/06589* (2013.01)

(58) Field of Classification Search
CPC ............ H01L 23/562; H01L 23/49816; H01L 23/49833; H01L 23/49838; H01L 25/0652; H01L 2225/06513; H01L 2225/06517; H01L 2225/0652; H01L 2225/06541; H01L 2225/06548; H01L 2225/06582; H01L 2225/06589

See application file for complete search history.

(56) References Cited

U.S. PATENT DOCUMENTS

| | | |
|---|---|---|
| 7,042,077 B2 | 5/2006 | Walk et al. |
| 9,570,370 B2 | 2/2017 | Oh et al. |

(Continued)

FOREIGN PATENT DOCUMENTS

KR   101440342 B1   9/2014

*Primary Examiner* — Antonio B Crite
*Assistant Examiner* — Tenley H Schofield
(74) *Attorney, Agent, or Firm* — HARNESS, DICKEY & PIERCE, P.L.C.

(57) ABSTRACT

A semiconductor package including a package base substrate, an interposer on the package base substrate, a plurality of semiconductor chips on the interposer, and a stiffener structure including a stiffener frame and a stiffener extension portion, the stiffener frame being on the package base substrate and apart from the interposer, the stiffener extension portion extending from the stiffener frame, spaced apart from the plurality of semiconductor chips, and extending onto the interposer to have a portion on the interposer, and the stiffener frame being an integral structure with the extension portion, may be provided.

19 Claims, 29 Drawing Sheets

(51) Int. Cl.
*H01L 23/495* (2006.01)
*H01L 23/498* (2006.01)
*H01L 23/522* (2006.01)
*H01L 23/528* (2006.01)
*H01L 23/532* (2006.01)
*H01L 25/065* (2023.01)

(56) References Cited

U.S. PATENT DOCUMENTS

| | | | |
|---|---|---|---|
| 9,583,431 | B1 | 2/2017 | Rahman et al. |
| 9,899,305 | B1 | 2/2018 | Yeh et al. |
| 9,917,042 | B2 | 3/2018 | Haba et al. |
| 10,573,579 | B2 | 2/2020 | Chen et al. |
| 2007/0069366 | A1* | 3/2007 | Chang ............... H01L 23/36 257/E23.101 |
| 2014/0048951 | A1 | 2/2014 | Lin et al. |
| 2017/0372979 | A1* | 12/2017 | Gandhi ............ H01L 23/3675 |
| 2020/0006246 | A1* | 1/2020 | Kong ............... H01L 25/105 |
| 2020/0411448 | A1* | 12/2020 | Goh ................ H01L 23/562 |
| 2021/0057354 | A1* | 2/2021 | Eid ................. H01L 23/562 |
| 2021/0193552 | A1* | 6/2021 | Wan ................. H01L 23/42 |
| 2022/0068736 | A1* | 3/2022 | Lo ................. H01L 21/6835 |

\* cited by examiner

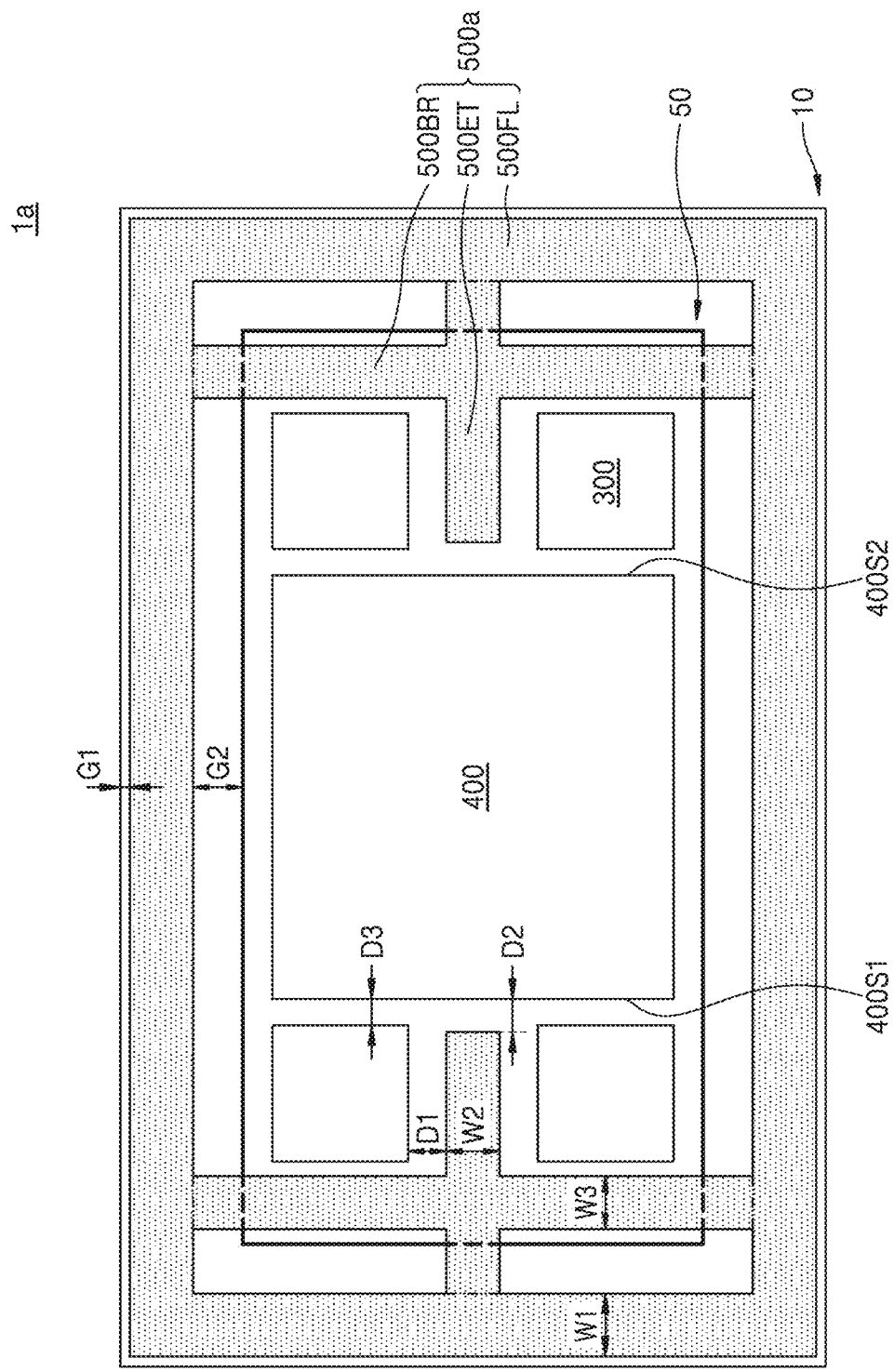

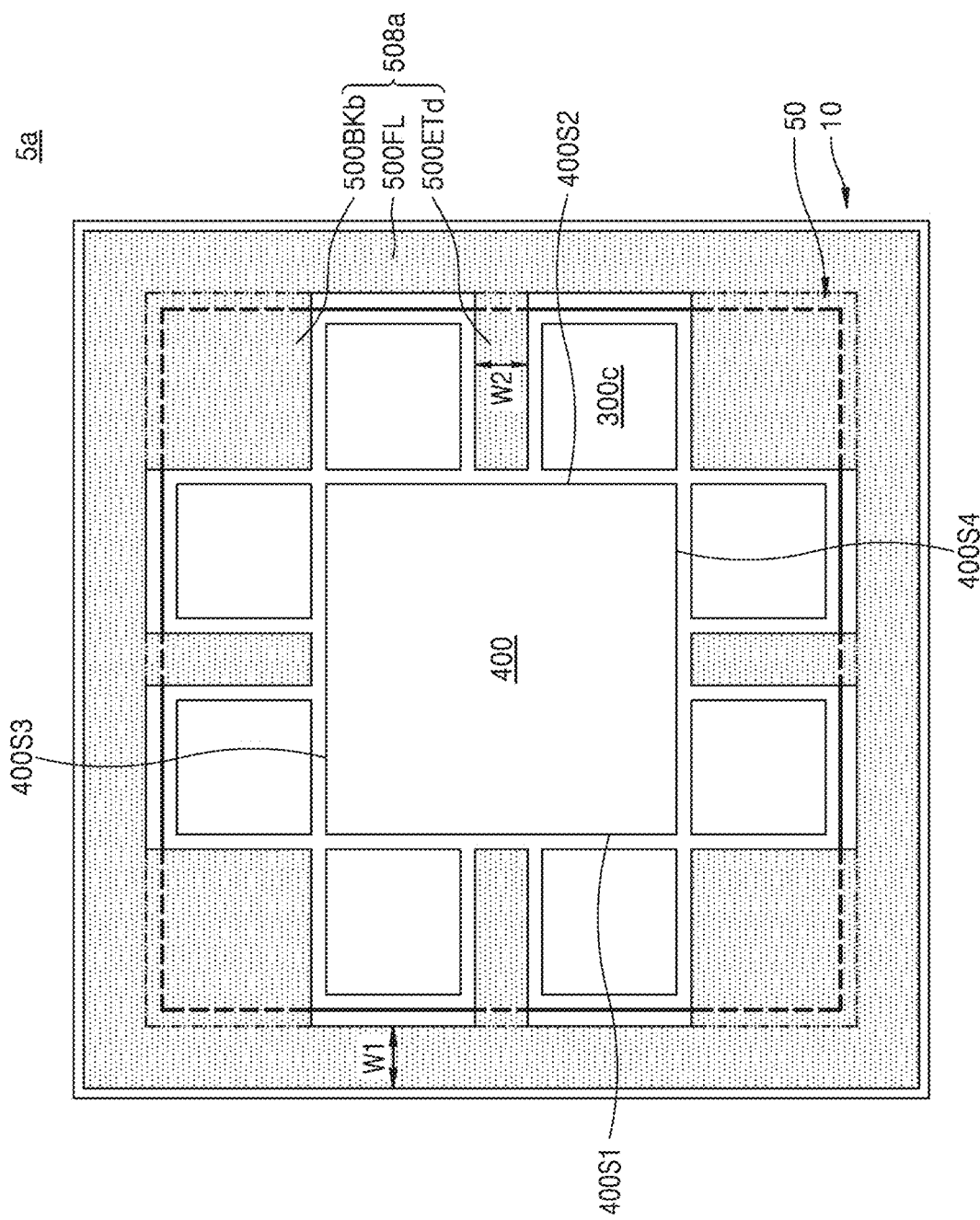

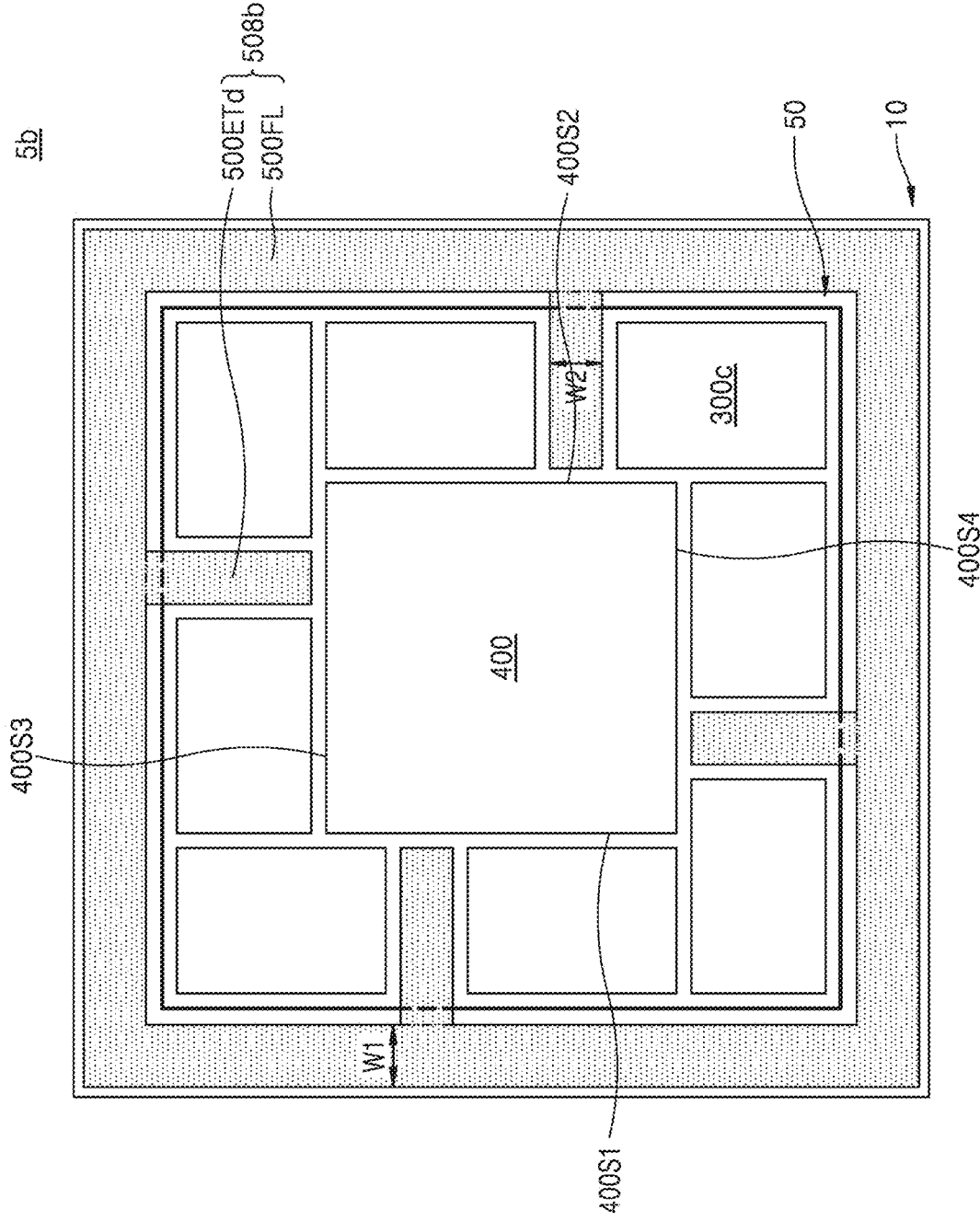

SEMICONDUCTOR PACKAGE HAVING STIFFENER STRUCTURE

CROSS-REFERENCE TO RELATED APPLICATION

This application is based on and claims priority under 35 U. S.C. § 119 to Korean Patent Application No. 10-2021-0075640, filed on Jun. 10, 2021, in the Korean Intellectual Property Office, the disclosure of which is incorporated by reference herein in its entirety.

BACKGROUND

The inventive concepts relate to semiconductor packages, and more particularly, to semiconductor packages including a stiffener structure.

According to the rapid development of the electronics industry and needs of users, a semiconductor package mounted on an electronic product is desired to include various functions. Accordingly, a semiconductor package including a plurality of semiconductor chips has been developed.

In addition, electronic products are made smaller and lighter, and to this end, a semiconductor package having a thin thickness is desired.

SUMMARY

The inventive concepts provide semiconductor packages having a stiffener structure that mitigates or prevents bending from occurring in the semiconductor package having a thin thickness and including a plurality of semiconductor chips.

In order to solve the above technical problem, the inventive concepts provide semiconductor packages as follows.

According to an aspect of the inventive concepts, a semiconductor package includes a package base substrate, an interposer on the package base substrate, a plurality of semiconductor chips on the interposer, and a stiffener structure including a stiffener frame and a stiffener extension portion, wherein the stiffener frame is on the package base substrate and apart from the interposer, the stiffener extension portion extends from the stiffener frame, is spaced apart from the plurality of semiconductor chips, and extends onto the interposer to have a portion on the interposer, and the stiffener frame is an integral structure with the extension portion.

According to another aspect of the inventive concepts, a semiconductor package includes a package base substrate, an interposer on the package base substrate, a plurality of memory stacks and a logic semiconductor chip on the interposer, the plurality of memory stacks and the logic semiconductor chip spaced apart from each other in a horizontal direction, and a stiffener structure including a stiffener frame and a stiffener extension portion, wherein the stiffener frame has a rectangular ring shape surrounding the interposer in a plan view, extends along an edge of the package base substrate on the package base substrate and is apart from the interposer, and the stiffener extension portion has a bar shape in a plan view and extends from the stiffener frame onto the interposer and is apart from the plurality of memory stacks and the logic semiconductor chip.

According to another aspect of the inventive concepts, a semiconductor package includes a package base substrate, an interposer spaced apart from an edge of the package base substrate in a plan view and attached to an inside of the package base substrate, a logic semiconductor chip on the interposer, a plurality of memory stacks spaced apart from the logic semiconductor chip and positioned on the interposer, each of the plurality of memory stacks including a first semiconductor chip and a plurality of second semiconductor chips sequentially stacked on the first semiconductor chip in a vertical direction, at least two of the plurality of memory stacks being adjacent to a first edge and a second edge of the logic semiconductor chip and being apart from each other, the first edge and the second edge being opposite to each other, and a stiffener structure including a stiffener frame and a stiffener extension portion, wherein the stiffener frame has a rectangular ring shape surrounding the interposer in a plan view, extends along the edge of the package base substrate, is apart from the interposer, and is on the package base substrate with a substrate thermal interface material layer therebetween, the substrate thermal interface material layer covering a lower surface of the stiffener frame, and the stiffener extension portion is an integral structure with the stiffener frame, the stiffener extension portion extending from the stiffener frame to between the at least two of the plurality of memory stacks, having a bar shape in a plan view, and being on the interposer with an interposer thermal interface material layer therebetween, the interposer thermal interface material layer covering a portion of a lower surface of the stiffener extension portion.

BRIEF DESCRIPTION OF THE DRAWINGS

Example embodiments of the inventive concepts will be more clearly understood from the following detailed description taken in conjunction with the accompanying drawings in which:

FIG. 2 is a plan layout of a semiconductor package according to an example embodiment of the inventive concepts;

FIGS. 21 to 23 are each a plan layout of a semiconductor package according to some example embodiments of the inventive concepts.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
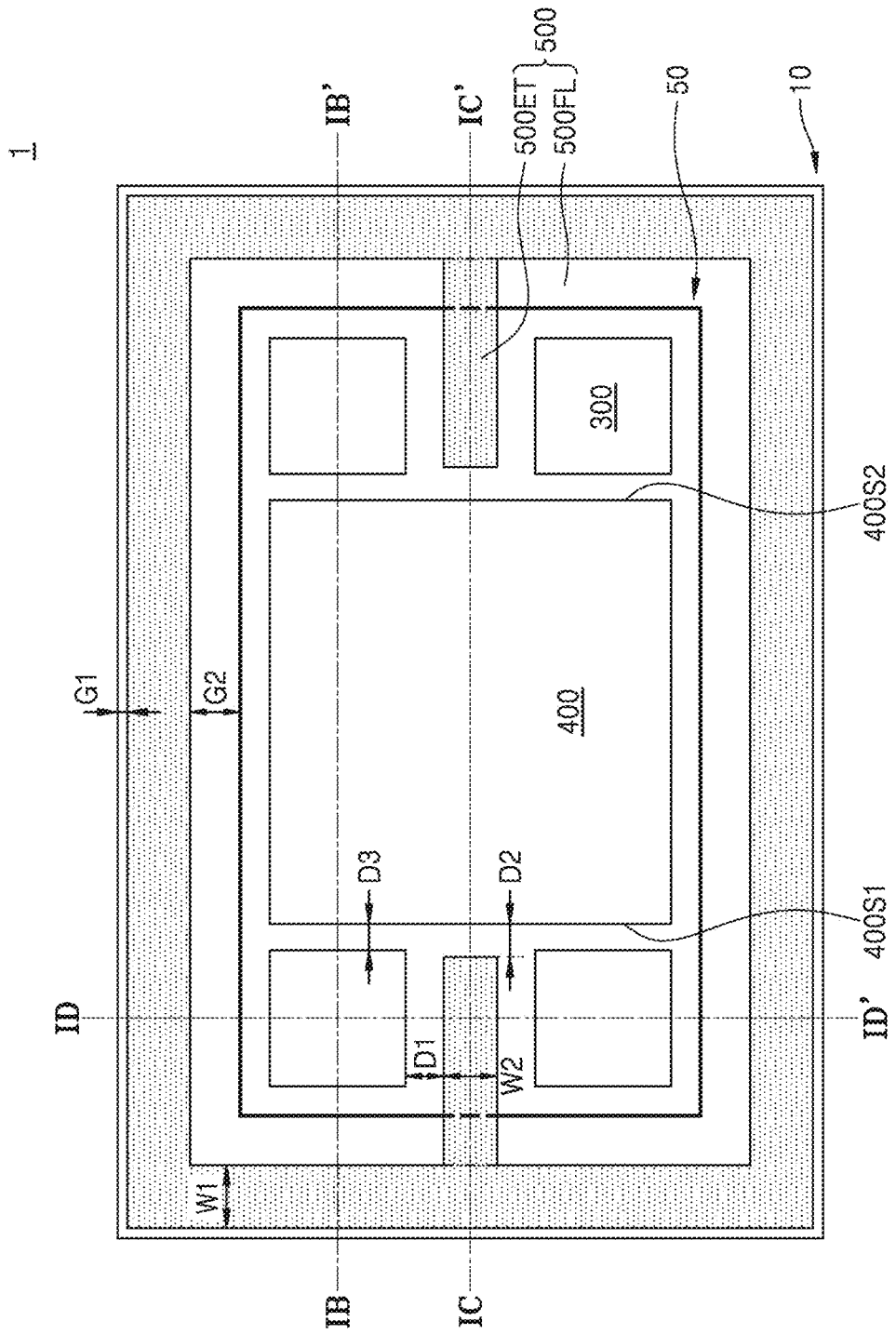
FIG. 1A is a plan layout of a semiconductor package according to an example embodiment of the inventive concepts.
Figure 1B:
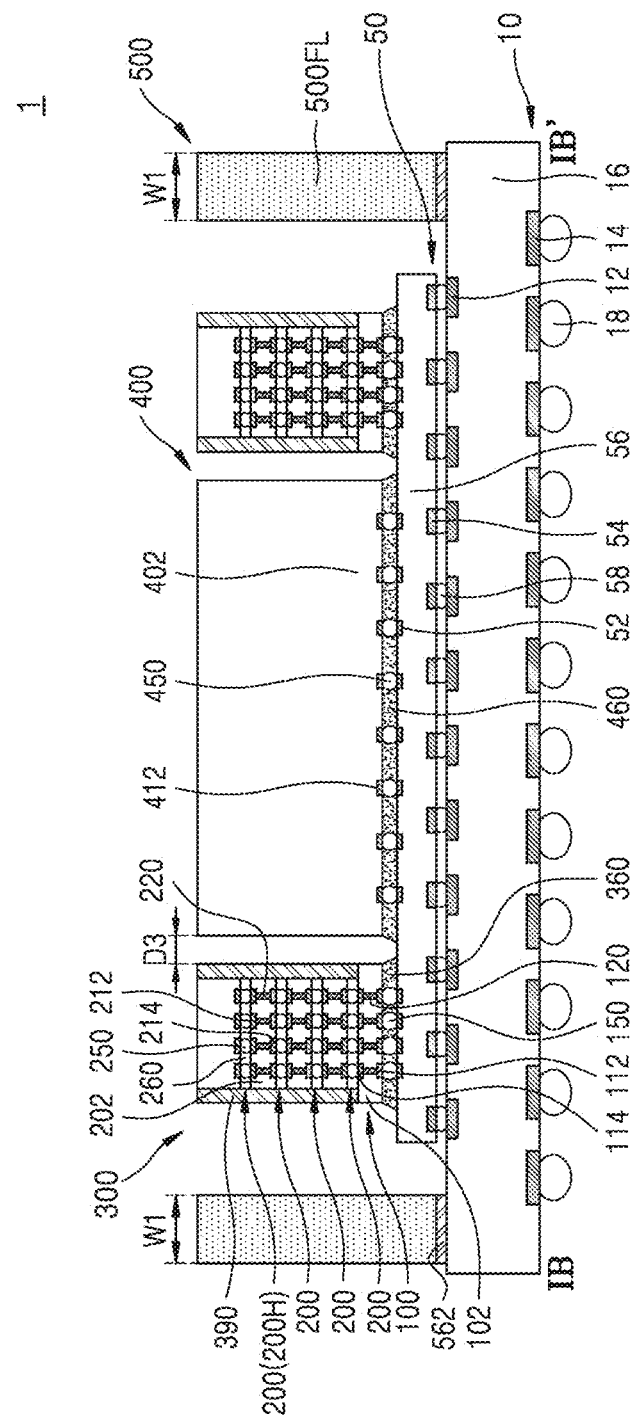
FIGS. 1B to 1D are cross-sectional views of the semiconductor package of FIG. 1A.
Figure 1C:
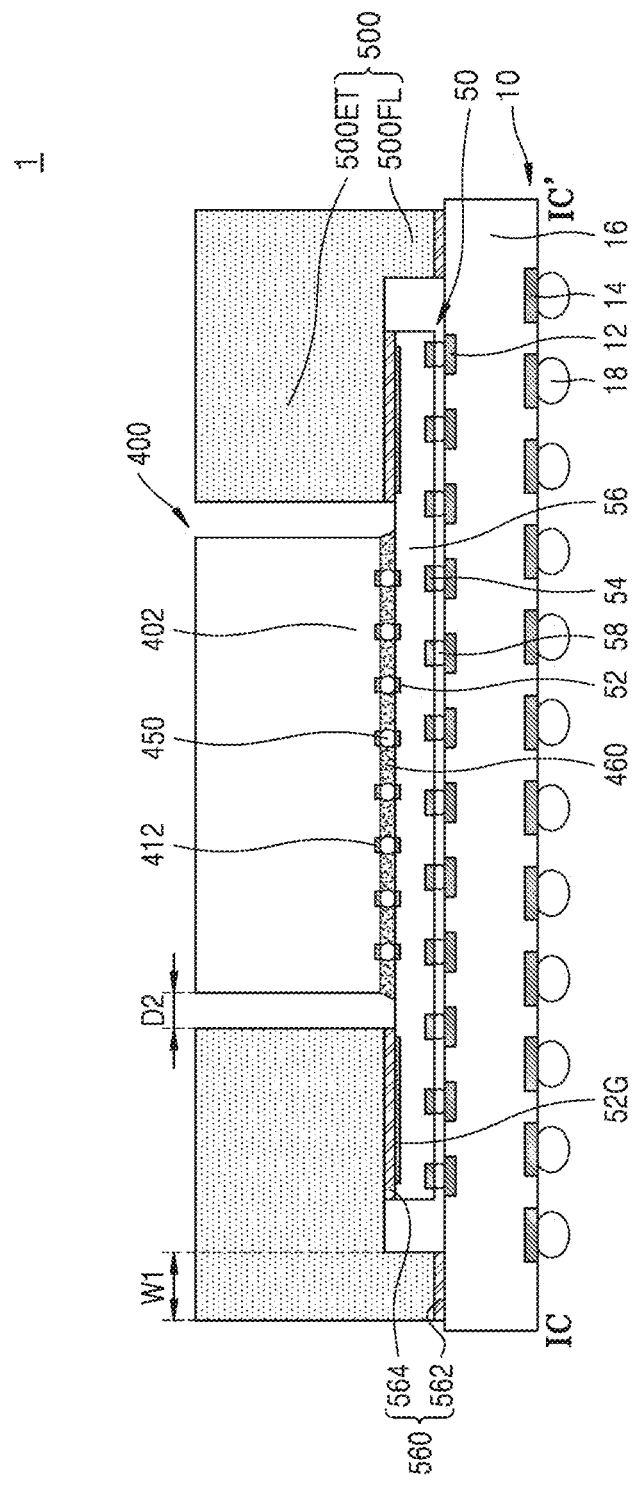
Figure 1D:
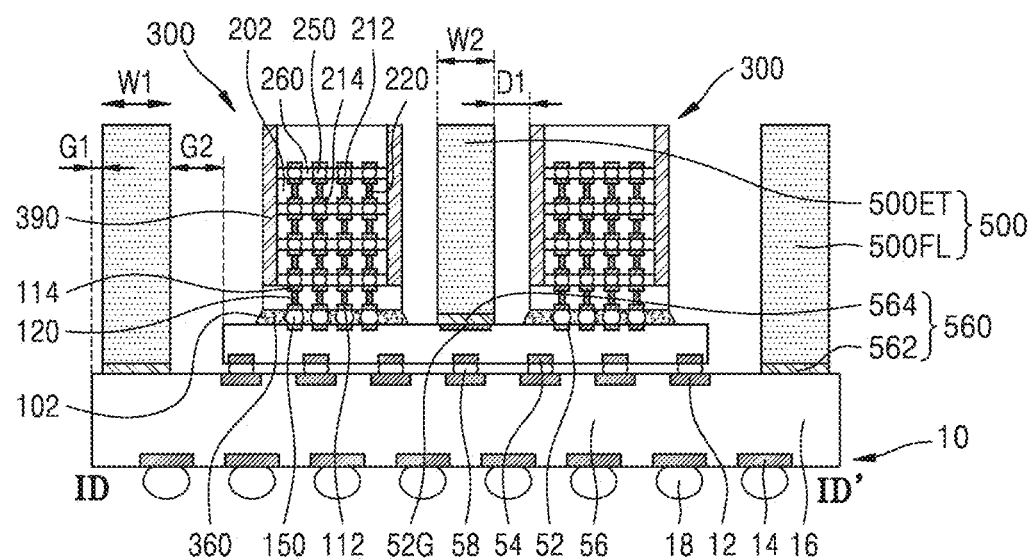

FIG. 1A is a plan layout of a semiconductor package 1 according to an example embodiment of the inventive concepts, and FIGS. 1B to 1D are cross-sectional views of the semiconductor package 1. In particular, FIGS. 1B, 1C, and 1D are cross-sectional views taken along lines IB-IB', IC-IC', and ID-ID' of FIG. 1A, respectively.

Referring to FIGS. 1A to 1D, the semiconductor package 1 includes a package base substrate 10, an interposer 50 and a stiffener structure 500 that are on the package base substrate 10, and a plurality of semiconductor chips on the interposer 50. The plurality of semiconductor chips may include a first semiconductor chip 100, a second semiconductor chip 200, and a third semiconductor chip 400. The first semiconductor chip 100 and the second semiconductor chip 200 may form a memory stack 300. The third semiconductor chip 400 may be referred to as a logic semiconductor chip 400. That is, the semiconductor package 1 may include the package base substrate 10, the interposer 50 and the stiffener structure 500 that are on the package base substrate 10, and a plurality of memory stacks 300 and the logic semiconductor chip 400 that are on the interposer 50. Each of the plurality of memory stacks 300 and the logic semiconductor chip 400 may be separated from each other in a horizontal direction.

Each of the plurality of memory stacks 300 includes the first semiconductor chip 100 and a plurality of second semiconductor chips 200 stacked on the first semiconductor chip 100. FIGS. 1B and 1D illustrate that each of the plurality of memory stacks 300 includes one first semiconductor chip 100 and four second semiconductor chips 200, but the inventive concepts are not limited thereto. For example, each of the memory stack 300 may include two or more second semiconductor chips 200. In some example embodiments, each of the plurality of memory stacks 300 may include a multiple of four of second semiconductor chips 200. The plurality of second semiconductor chips 200 may be sequentially stacked on the first semiconductor chip 100 in a vertical direction. The first semiconductor chip 100 and each of the plurality of second semiconductor chips 200 may be sequentially stacked with an active surface thereof facing downward, that is, facing the interposer 50.

Some example of each of the plurality of memory stacks 300 may include dynamic random access memory (DRAM), static RAM (SRAM), flash memory, electrically erasable and programmable read-only memory (EEPROM), phase-change random access memory (PRAM), magnetic random access memory (MRAM), and resistive random access memory (RRAM).

In some example embodiments, the first semiconductor chip 100 included in each of the plurality of memory stacks 300 may not include a memory cell, and the second semiconductor chip 200 may include a memory cell. For example, the first semiconductor chip 100 may be a buffer chip including a serial-parallel conversion circuit, a test logic circuit such as design for test (DFT), Joint Test Action Group (JTAG), and memory built-in self-test (MBIST), and a signal interface circuit such as a physical layer (PHY), and the second semiconductor chip 200 may be a memory semiconductor chip. In some example embodiments, the first semiconductor chip 100 may be a buffer chip for controlling high bandwidth memory (HBM) DRAM, and the second semiconductor chip 200 may be a memory semiconductor chip having a cell of HBM DRAM controlled by the first semiconductor chip 100. The first semiconductor chip 100 may be referred to as a master chip, and the second semiconductor chip 200 may be referred to as a slave chip.

The first semiconductor chip 100 may include a first substrate 102, a plurality of first front surface connection pads 112, a plurality of first rear surface connection pads 114, and a plurality of first through electrodes 120. The second semiconductor chip 200 may include a second substrate 202, a plurality of second front surface connection pads 212, a plurality of second rear surface connection pads 214, and a plurality of second through electrodes 220.

The first substrate 102 and the second substrate 202 may include silicon (Si). In some example embodiments, the first substrate 102 and the second substrate 202 may include a semiconductor element such as germanium (Ge), or a compound semiconductor such as silicon carbide (SiC), gallium arsenide (GaAs), indium arsenide (InAs), and indium phosphide (InP). Each of the first substrate 102 and the second substrate 202 may have an active surface and an inactive surface opposite to the active surface. Each of the first substrate 102 and the second substrate 202 may include a plurality of individual devices of various types on the active surface thereof. The plurality of individual devices may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, a passive device, or the like.

The first semiconductor chip 100 and the second semiconductor chip 200 may respectively include a first semiconductor device and a second semiconductor device formed by the plurality of individual devices.

The first semiconductor device may be formed on the active surface of the first substrate 102, the plurality of first front surface connection pads 112 and the plurality of first rear surface connection pads 114 may be respectively arranged on the active surface and the inactive surface of the first substrate 102, and the plurality of first through electrodes 120 may electrically connect the plurality of first front surface connection pads 112 to the plurality of first rear surface connection pads 114 by vertically penetrating a portion of the first substrate 102.

The second semiconductor device may be formed on the active surface of the second substrate 202, the plurality of second front surface connection pads 212 and the plurality of second rear surface connection pads 214 may be arranged on the active surface and the inactive surface of the second substrate 202, respectively, and the plurality of second through electrodes 220 may electrically connect the plurality of second front surface connection pads 212 to the plurality of second rear surface connection pads 214 by vertically penetrating a portion of the second substrate 202. The plurality of second through electrodes 220 may be electrically connected to the plurality of first through electrodes 120, respectively.

A plurality of first connection terminals 150 may be on the plurality of first front surface connection pads 112 of the first semiconductor chip 100, respectively. A plurality of second connection terminals 250 may be on the plurality of second front surface connection pads 212 of the second semiconductor chip 200, respectively. The plurality of second connection terminals 250 may electrically connect between the plurality of first rear surface connection pads 114 of the first semiconductor chip 100 and the plurality of second front surface connection pads 212 of the second semiconductor chip 200, which is on the lowermost end of the plurality of second semiconductor chips 200, and may electrically connect between the plurality of second rear surface connection pads 214 and the plurality of second front surface connection pads 212 of each of the plurality of second semiconductor chips 200.

A horizontal width and area of the first semiconductor chip 100 may be greater than a horizontal width and area of each of the plurality of second semiconductor chips 200.

In some example embodiments, among the plurality of second semiconductor chips 200, a second semiconductor chip 200H arranged at the uppermost end farthest from the first semiconductor chip 100 may not include the plurality of rear connection pads 214 and the plurality of second through electrodes 220. In some example embodiments, among the plurality of second semiconductor chips 200, the second semiconductor chip 200H arranged at the uppermost end farthest from the first semiconductor chip 100 may have a thickness greater than that of the other second semiconductor chips 200.

An insulating adhesive layer 260 may be between the first semiconductor chip 100 and the lowermost one of the plurality of second semiconductor chips 200 and between a vertically adjacent pair of the plurality of second semiconductor chips 200. The insulating adhesive layer 260 may be on a lower surface of each of the plurality of second semiconductor chips 200 to attach each of the plurality of second semiconductor chips 200 to a lower structure, for example, the first semiconductor chip 100 or other second semiconductor chips 200 on a lower side among the plurality of second semiconductor chips 200. The insulating adhesive layer 260 may include a non-conductive film (NCF), a non-conductive paste (NCP), an insulating polymer, or an epoxy resin. The insulating adhesive layer 260 may surround the plurality of second connection terminals 250 and may fill spaces between the first semiconductor chip 100 and each of the plurality of second semiconductor chips 200.

Each of the plurality of memory stacks 300 may further include a molding layer 390 surrounding the plurality of second semiconductor chips 200 and the insulating adhesive layer 260 on the first semiconductor chip 100. The molding layer 390 may include, for example, an epoxy mold compound. In some example embodiments, the molding layer 390 may not cover an upper surface of the second semiconductor chip 200H arranged uppermost.

The logic semiconductor chip 400 may include a third substrate 402 having an active surface on which a third semiconductor device is formed, and a plurality of third front surface connection pads 412 arranged on the active surface of the third substrate 402. The third substrate 402 is the same as or substantially similar to the first substrate 102 and the second substrate 202, and thus a detailed description thereof is omitted. A plurality of third connection terminals 450 may be on the plurality of third front surface connection pads 412 of the logic semiconductor chip 400, respectively.

The logic semiconductor chip 400 may include, for example, one of a central processing unit (CPU) chip, a graphics processing unit (GPU) chip, an application processor (AP) chip, an Application Specific Integrated Circuit (ASIC) or other processing chips.

A first underfill layer 360 may be arranged between the memory stack 300 and the interposer 50, and a second underfill layer 460 may be arranged between the logic semiconductor chip 400 and the interposer 50. The first underfill layer 360 may surround the plurality of first connection terminals 150 and fill a space between the first semiconductor chip 100 of the memory stack 300 and the interposer 50, and the second underfill layer 460 may surround the plurality of third connection terminals 450 and fill a space between the logic semiconductor chip 400 and the interposer 50.

In some example embodiments, the semiconductor package 1 includes four memory stacks 300 and one logic semiconductor chip 400. The four memory stacks 300 may be arranged adjacent to both sides of the one logic semiconductor chip 400, that is, two of the four memory stacks may be arranged adjacent to each of a first edge 400S1 and a second edge 400S2 that are two opposite edges among four edges of the logic semiconductor chip 400.

The package base substrate 10 may include a base board layer 16, and a plurality of first upper surface pads 12 and a plurality of first lower surface pads 14 that are arranged on upper and lower surfaces of the base board layer 16, respectively. The package base substrate 10 may include a plurality of first wiring paths (not shown) electrically connecting the plurality of first upper surface pads 12 to the plurality of first lower surface pads 14 through the base board layer 16. In some example embodiments, the package base substrate 10 may be a printed circuit board. For example, the package base substrate 10 may be a multi-layer printed circuit board.

The base board layer 16 may include at least one material selected from a phenol resin, an epoxy resin, and polyimide. For example, the base board layer 16 may include at least one material selected from frame retardant 4 (FR-4), tetrafunctional epoxy, polyphenylene ether, epoxy/polyphenylene oxide, bismaleimide triazine (BT), thermount, cyanate ester, polyimide, and a liquid crystal polymer. In some example embodiments, the base board layer 16 may include, for example, polyester, polyethylene terephthalate (PET), fluorinated ethylene propylene (FEP), a resin-coated paper, a liquid polyimide resin, a polyethylene naphthalate (PEN) film, or the like. The base board layer 16 may be formed by stacking a plurality of base layers.

The plurality of first upper surface pads 12 and the plurality of first lower surface pads 14 may include copper, nickel, stainless steel, or beryllium copper. For example, the plurality of first upper surface pads 12 and the plurality of first lower surface pads 14 may include plated copper. In some example embodiments, a surface portion of the plurality of first upper surface pads 12 and/or a surface portion of the plurality of first lower surface pads 14 that are opposite to the base board layer 16 may include nickel (Ni)/silver (Au), or the like.

The plurality of first wiring paths may include a buried conductive layer (not shown) and a conductive via (not shown). The plurality of first wiring paths may include, for example, electrolytically deposited (ED) copper, rolled-annealed (RA) copper foil, stainless steel foil, aluminum foil, ultra-thin copper foils, sputtered copper, copper alloys, Ni, stainless steel, beryllium copper, or the like.

The base board layer 16 may further include a solder resist layer (not shown) exposing the plurality of first upper surface pads 12 and the plurality of first lower surface pads 14 on the upper surface and the lower surface of the base board layer 16, respectively. The solder resist layer may include a polyimide film, a polyester film, a flexible solder mask, a photoimageable coverlay (PIC), a photo-imageable solder resist, or the like. The solder resist layer may be formed by, for example, thermosetting a thermosetting ink applied by a silk screen printing method or an inkjet method. The solder resist layer may be formed by, for example, thermosetting after removing a portion of a photosensitive solder resist applied by a screen method or a spray coating method through exposure and development. The solder resist layer may be formed by, for example, laminating a polyimide film or a polyester film.

A plurality of board connection terminals 58 may be connected to the plurality of first upper surface pads 12, respectively, and a plurality of external connection terminals 18 may be connected to the plurality of first lower surface pads 14, respectively. The plurality of board connection terminals 58 may electrically connect between a plurality of second lower surface pads 54 of the interposer 50 and the plurality of first upper surface pads 12. The plurality of external connection terminals 18 connected to plurality of first lower surface pads 14 may connect the semiconductor package 1 to the outside.

The interposer 50 may include a base layer 56, and a plurality of second upper surface pads 52 and the plurality of second lower surface pads 54 arranged on upper and lower surfaces of the base layer 56, respectively.

In some example embodiments, the base layer 56 may include a semiconductor material, glass, ceramic, or plastic. For example, in some example embodiments, the interposer 50 may be a silicon interposer in which the base layer 56 is formed from a silicon semiconductor substrate. In some example embodiments, the interposer 50 may be a redistribution interposer in which the base layer 56 includes at least one of an oxide, a nitride, and a photo imageable dielectric (PID). For example, the base layer 56 may include silicon oxide, silicon nitride, epoxy, or polyimide.

In some example embodiments, a plurality of interposer through electrodes (not shown) vertically penetrating at least a portion of the base layer 56 may be arranged inside the base layer 56. The plurality of interposer through electrodes may electrically connect the plurality of second upper surface pads 52 to the plurality of second lower surface pads 54. Each of the plurality of interposer through electrodes may include a conductive plug penetrating the base layer 56 and a conductive barrier film surrounding the conductive plug. The conductive plug may have a cylindrical shape, and the conductive barrier film may have a cylindrical shape surrounding a sidewall of the conductive plug. A plurality of via insulating films may be between the base layer 56 and the plurality of interposer through electrodes to surround sidewalls of the plurality of interposer through electrodes. In some other example embodiments, redistribution conductive patterns and redistribution conductive vias electrically connecting the plurality of second upper surface pads 52 to the plurality of second lower surface pads 54 may be arranged inside the base layer 56.

For example, the plurality of second upper surface pads 52 and the plurality of second lower surface pads 54 may include copper, Ni, stainless steel, or a copper alloy such as beryllium copper.

The plurality of first connection terminals 150 and the plurality of third connection terminals 450 may be on the plurality of second upper surface pads 52, and thus, the plurality of memory stacks 300 and the logic semiconductor chip 400 may be electrically connected to the interposer 50.

Some of the plurality of second upper surface pads 52 may be ground pads 52G (e.g., pads that are grounded). For example, the plurality of first connection terminals 150 and the plurality of third connection terminals 450 may not be attached to the ground pads 52G, and the plurality of first connection terminals 150 and the plurality of third connection terminals 450 may be attached to the rest of the plurality of second upper surface pads 52. In some example embodiments, a planar shape of the ground pads 52G among the plurality of second upper surface pads 52 may be different from the rest of the plurality of second upper surface pads 52. For example, the planar shape of the ground pads 52G among the plurality of second upper surface pads 52 may be a bar shape, a rectangular shape, or the like, and the rest of the plurality of second upper surface pads 52 may have a circular shape or a square shape. As another example, a horizontal area and a horizontal width of the ground pads 52G among the plurality of second upper surface pads 52 may be greater than a horizontal area and a horizontal width of the rest of the plurality of second upper surface pads 52.

The plurality of board connection terminals 58 may be attached to the plurality of second lower surface pads 54. In some example embodiments, the plurality of board connection terminals 58 may include a conductive material, for example, copper (Cu), aluminum (Al), Ag, tin (Tin), gold (Au), or solder, but the inventive concepts are not limited thereto. The plurality of board connection terminals 58 may include a multilayer or a single layer. For example, each of the plurality of board connection terminals 58 may include a under bump metallization (UBM) layer and an interposer conductive cap on the UBM layer.

A horizontal area of the interposer 50 may be less than a horizontal area of the package base substrate 10. In a plan view, an edge of the interposer 50 may be apart from an edge of the package base substrate 10. That is, in a plan view, the interposer 50 may be attached to the inside of the package base substrate 10, which is apart from the edge of the package base substrate 10.

The stiffener structure 500 may be on the package base substrate 10 and the interposer 50. The stiffener structure 500 may be on the package base substrate 10 and the interposer 50 with a stiffener thermal interface material layer 560 therebetween. The stiffener structure 500 may be apart from the memory stack 300 including the first semiconductor chip 100 and the second semiconductor chip 200 and the logic semiconductor chip 400. The stiffener structure 500 may not overlap the memory stack 300 including the first semiconductor chip 100 and the second semiconductor chip 200 and the logic semiconductor chip 400 in a vertical direction. In a plan view, that is, a top view, the stiffener structure 500 may surround the memory stack 300 including the first semiconductor chip 100 and the second semiconductor chip 200 and the logic semiconductor chip 400.

The stiffener structure 500 may include metal. For example, the stiffener structure 500 may include at least one of Cu, Ni, or stainless steel. The stiffener thermal interface material layer 560 may include an insulating material or a material capable of maintaining electrical insulation by including an insulating material. The stiffener thermal interface material layer 560 may include, for example, an epoxy resin. The stiffener thermal interface material layer 560 may be, for example, a mineral oil, grease, gap filler putty, a phase change gel, phase change material pads, or particle filled epoxy. The stiffener thermal interface material layer 560 may include a substrate thermal interface material layer 562 and an interposer thermal interface material layer 564. The substrate thermal interface material layer 562 may be between the stiffener structure 500 and the package base substrate 10, and the interposer thermal interface material layer 564 may be between the stiffener structure 500 and the interposer 50. The stiffener structure 500 may have a thickness of, for example, about 50 µm to about 100 µm.

The stiffener structure 500 may include a stiffener film (interchangeably referred to as "stiffener frame") 500FL and a stiffener extension portion 500ET. The stiffener film 500FL may be integrally formed with the stiffener extension portion 500ET. The stiffener film 500FL may be on the package base substrate 10 with the substrate thermal interface material layer 562 therebetween, wherein the substrate thermal interface material layer 562 is attached to a lower surface of the stiffener film 500FL. The stiffener extension portion 500ET may be on the interposer 50 with the interposer thermal interface material layer 564 therebetween, wherein the interposer thermal interface material layer 564 is on a lower surface of the stiffener extension portion 500ET.

The stiffener film 500FL may extend along an edge of the package base substrate 10 and have a rectangular ring shape surrounding the interposer 50 in a plan view. The stiffener film 500FL may have a shape in which four sidewalls extending along four edges of the package base substrate, respectively, 10 are connected to each other. The stiffener extension portion 500ET may have a bar shape extending from a sidewall of the stiffener film 500FL onto the interposer 50.

In some example embodiments, the substrate thermal interface material layer 562 may entirely cover a lower surface of the stiffener film 500FL. The stiffener film 500FL may be apart from an edge of the package base substrate 10 by a first separation distance G1. For example, the first separation distance G1 may be 0 mm to about 1 mm That is, the stiffener film 500FL may be in contact with the edge of the package base substrate 10, or may be apart from and adjacent to the edge of the package base substrate 10. The stiffener film 500FL may be apart from an edge of the interposer 50 by a second separation distance G2. The second separation distance G2 may be greater than the first separation distance G1. For example, the second separation distance G2 may be about 1 mm to about 5 mm.

The stiffener extension portion 500ET may extend from the stiffener film 500FL onto the interposer 50. The stiffener extension portion 500ET may extend in a direction from the package base substrate 10 onto the interposer 50, but may be apart from the package base substrate 10, and may be on the interposer 50 with the interposer thermal interface material layer 564 therebetween. In a plan view, a portion of the stiffener extension portion 500ET may overlap the interposer 50, and the remaining portion thereof may not overlap the interposer 50. The interposer thermal interface material layer 564 may be on a portion of the lower surface of the stiffener extension portion 500ET, the portion overlapping the interposer 50, and may not be on the remaining portion of the lower surface of the stiffener extension portion 500ET, the remaining portion not overlapping the interposer 50.

The stiffener film 500FL may be on the base board layer 16 without overlapping the plurality of first upper surface pads 12 in the vertical direction. The substrate thermal interface material layer 562 may contact the base board layer 16 without contacting the plurality of first upper surface pads 12. In some example embodiments, when the package base substrate 10 includes a solder resist layer, the substrate thermal interface material layer 562 may contact the solder resist layer. The stiffener extension portion 500ET may overlap the ground pad 52G in the vertical direction. The interposer thermal interface material layer 564 may contact the ground pad 52G. In some example embodiments, the interposer thermal interface material layer 564 may not contact the rest of the plurality of second upper surface pads 52 except for the ground pad 52G.

The stiffener film 500FL may have a first width W1 and may extend along an edge of the package base substrate 10. The stiffener extension portion 500ET may have a second width W2 and may extend from the stiffener film 500FL onto the interposer 50. The second width W2 may be equal to or less than the first width W1. For example, the first width W1 may be about 1 mm to about 3 mm, and the second width W2 may be about 100 µm to about 2 mm. An upper surface of the stiffener film 500FL may be at the same or substantially similar vertical level as an upper surface of the stiffener extension portion 500ET. The lower surface of the stiffener extension portion 500ET may be at a higher vertical level than the lower surface of the stiffener film 500FL. The lower surface of the stiffener film 500FL may be at a lower vertical level than the upper surface of the interposer 50. The lower surface of the stiffener film 500FL may be adjacent to an upper surface of the package base substrate 10. Thus, the lower surface of the stiffener film 500FL may be at the same or substantially similar vertical level as the upper surface of the package base substrate 10. The lower surface of the stiffener extension portion 500ET may be at a higher vertical level than the upper surface of the interposer 50. A portion of the lower surface of the stiffener extension portion 500ET may be adjacent to the upper surface of the interposer 50. Thus, the lower surface of the stiffener extension portion 500ET may be at the same or substantially similar vertical level as the upper surface of the interposer 50.

The stiffener extension portion 500ET may have a substantially constant thickness (e.g., a vertical height), of about 100 µm to about 200 µm, which is less than that of the stiffener film 500FL. In some example embodiments, the stiffener film 500FL may have a substantially constant thickness of about 500 µm to about 800 µm, and the stiffener extension portion 500ET may have a thickness of about 300 µm to about 700 µm.

In some example embodiments, the stiffener structure 500 may include the stiffener film 500FL extending along the edge of the package base substrate 10 and having a rectangular ring shape surrounding the interposer 50 and two stiffener extension portions 500ET extending from the stiffener film 500FL onto the interposer 50. Each of the two stiffener extension portions 500ET may extend between two memory stacks 300. Each of the two stiffener extension portions 500ET may extend between the two memory stacks 300 adjacent to each other from two opposing sidewalls among four sidewalls of the stiffener film 500FL. For example, one of the two stiffener extension portions 500ET may extend between two memory stacks 300 arranged adjacent to the first edge 400S1 of the logic semiconductor chip 400, and the other one may extend between two memory stacks 300 arranged adjacent to the second edge 400S2 of the logic semiconductor chip 400. One end of the stiffener extension portion 500ET may contact the stiffener film 500FL, and the other end thereof may face the first edge 400S1 or the second edge 400S2 of the logic semiconductor chip 400 and be apart from the logic semiconductor chip 400.

The stiffener extension portion 500ET may be apart from the memory stack 300 by a first distance D1, and may be apart from the logic semiconductor chip 400 by a second distance D2. The second distance D2 may be less than the first distance D1. The memory stack 300 may be apart from the logic semiconductor chip 400 by a third distance D3. The third distance D3 may be equal to or greater than the second distance D2. For example, the first distance D1 may be about 20 μm to about 100 μm, the second distance D2 may be about 20 μm to about 80 μm, and the third distance D3 may be about 20 μm to about 100 μm.

In some example embodiments, an upper surface of each of the memory stack 300, the logic semiconductor chip 400, and the stiffener structure 500 may be at the same vertical level. In some other example embodiments, the upper surface of the stiffener structure 500 may be at a vertical level that is about 10 μm to about 50 μm lower than a vertical level of the upper surface of each of the memory stack 300 and the logic semiconductor chip 400.

The semiconductor package 1 according to the example embodiment may include the stiffener structure 500 including the stiffener film 500FL being in contact with or adjacent to the edge of the package base substrate 10 and extending along the edge of the package base substrate 10, and the stiffener extension portion 500ET extending from the stiffener film 500FL onto the interposer 50 and extending between two memory stacks 300 arranged adjacently. Accordingly, heat generated by the plurality of semiconductor chips may be emitted to the outside through the stiffener structure 500, and the stiffener film 500FL on the package base substrate 10 are integrally formed with the stiffener extension portion 500ET on the interposer 50, and thus, the semiconductor package 1 may be mitigated or prevented from being bent.

FIG. 2 is a plan layout of a semiconductor package 1a according to an example embodiment of the inventive concepts. In FIG. 2, the same reference numerals as those of FIGS. 1A to 1D refer to the same elements, and redundant descriptions thereof are omitted.

Referring to FIG. 2, the semiconductor package 1a may include the package base substrate 10, the interposer 50 and a stiffener structure 500a that are on the package base substrate 10, and the plurality of memory stacks 300 and the logic semiconductor chip 400 that are on the interposer 50.

The stiffener structure 500a may include the stiffener film 500FL, the stiffener extension portion 500ET, and a stiffener bridge 500BR. The stiffener film 500FL, the stiffener extension portion 500ET, and the stiffener bridge 500BR may be integrally formed. The interposer thermal interface material layer 564 as shown in FIGS. 1B to 1D may be on a portion of a lower surface of each of the stiffener extension portion 500ET and the stiffener bridge 500BR, and the stiffener extension portion 500ET and the stiffener bridge 500BR may be on the interposer 50 with the interposer thermal interface material layer 564 therebetween. In addition, the stiffener extension portion 500ET and the stiffener bridge 500BR may overlap the ground pad 52G as shown in FIGS. 1B to 1D in the vertical direction.

The stiffener film 500FL may extend along the edge of the package base substrate 10 and have a rectangular ring shape surrounding the interposer 50. The stiffener film 500FL may have a shape in which four sidewalls thereof extending along four edges of the package base substrate 10, respectively, are connected to each other.

The stiffener bridge 500BR may extend from a portion of the stiffener film 500FL to other portion of the stiffener film 500FL via (e.g., over) the interposer 50, and may be apart from the package base substrate 10. The stiffener bridge 500BR may extend between two opposing sidewalls among the four sidewalls of the stiffener film 500FL, and may extend along a portion adjacent to the edge of the interposer 50. For example, the stiffener bridge 500BR may have a bar shape extending through a portion adjacent to the edge of the interposer 50 on a side opposite to the logic semiconductor chip 400 with respect to the memory stack 300.

The stiffener extension portion 500ET may extend from the stiffener film 500FL onto the interposer 50, and may be apart from the package base substrate 10. The stiffener extension portion 500ET may extend between two memory stacks 300, which are adjacent to each other.

The stiffener extension portion 500ET may extend by intersecting with the stiffener bridge 500BR. For example, an extension direction of the stiffener extension portion 500ET and an extension direction of the stiffener bridge 500BR may be orthogonal to each other. A portion where the stiffener extension portion 500ET and the stiffener bridge 500BR intersect may be a portion of the stiffener extension portion 500ET and a portion of the stiffener bridge 500BR. The stiffener extension portion 500ET may extend with the second width W2, and the stiffener bridge 500BR may extend with a third width W3. The second width W2 may be equal to or similar to the third width W3.

The stiffener extension portion 500ET refers to a portion of the stiffener structure 500, the portion extending from the stiffener film 500FL onto the interposer 50. Accordingly, the stiffener bridge 500BR may be two stiffener extension portions extending in a direction orthogonal to the stiffener extension portion 500ET from two opposing sidewalls among the four sidewalls of the stiffener film 500FL to a portion of the stiffener extension portion 500ET on the interposer 50. That is, it may be said that one stiffener bridge 500BR includes two stiffener extension portions arranged on the same straight line. In some example embodiments, one stiffener bridge 500BR may be a stiffener extension portion extending from one sidewall of the stiffener film 500FL onto the interposer 50 and further extending to other one opposing sidewall.

In some example embodiments, the stiffener structure 500a may include the stiffener film 500FL extending along the edge of the package base substrate 10 and having a rectangular ring shape surrounding the interposer 50, two stiffener extension portions 500ET each extending from the stiffener film 500FL onto the interposer 50, and two stiffener bridges 500BR each extending between two opposing sidewalls among the four sidewalls of the stiffener film 500FL and extending along a portion adjacent to a corresponding one of two opposing edges among four edges of the interposer 50. Each of the two stiffener extension portions 500ET may intersect with a different stiffener bridge 500BR from each other among the two stiffener bridges 500BR.

The semiconductor package 1a according to the example embodiment may include the stiffener structure 500a including the stiffener film 500FL being in contact with or adjacent to the edge of the package base substrate 10 and extending along the edge of the package base substrate 10, the stiffener extension portion 500ET extending from the stiffener film 500FL onto the interposer 50 and extending between two memory stacks 300 arranged adjacently, and the stiffener bridge 500BR extending over a portion adjacent to the edge of the interposer 50. Accordingly, heat generated by the plurality of semiconductor chips may be emitted to the outside through the stiffener structure 500a, and the stiffener film 500FL on the package base substrate 10 are integrally formed with the stiffener extension portion 500ET and the stiffener bridge 500BR on the interposer 50, and thus, the semiconductor package 1a may be mitigated or prevented from being bent.

Figure 3A:
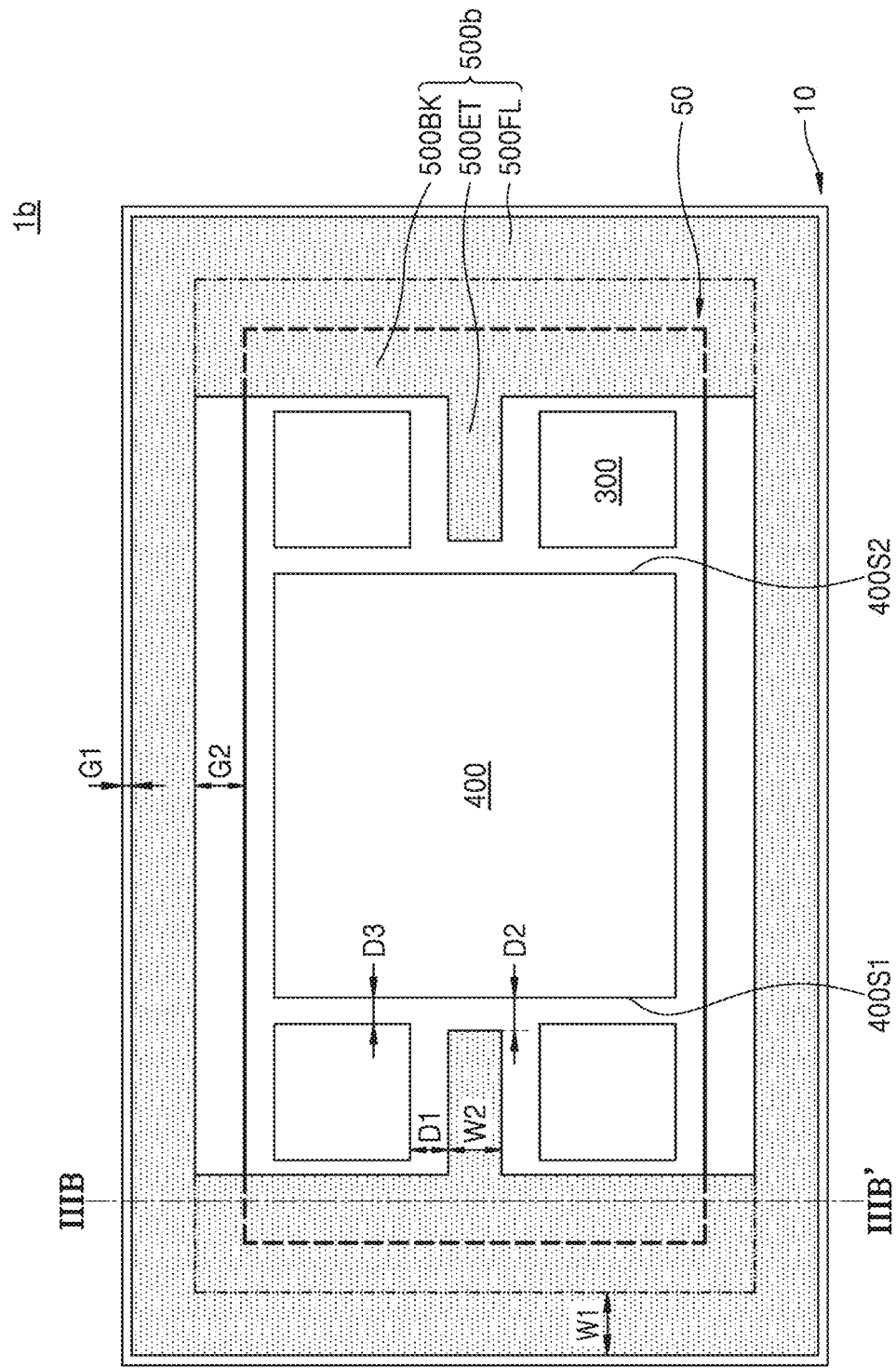
FIG. 3A is a plan layout of a semiconductor package according to an example embodiment of the inventive concepts.
Figure 3B:
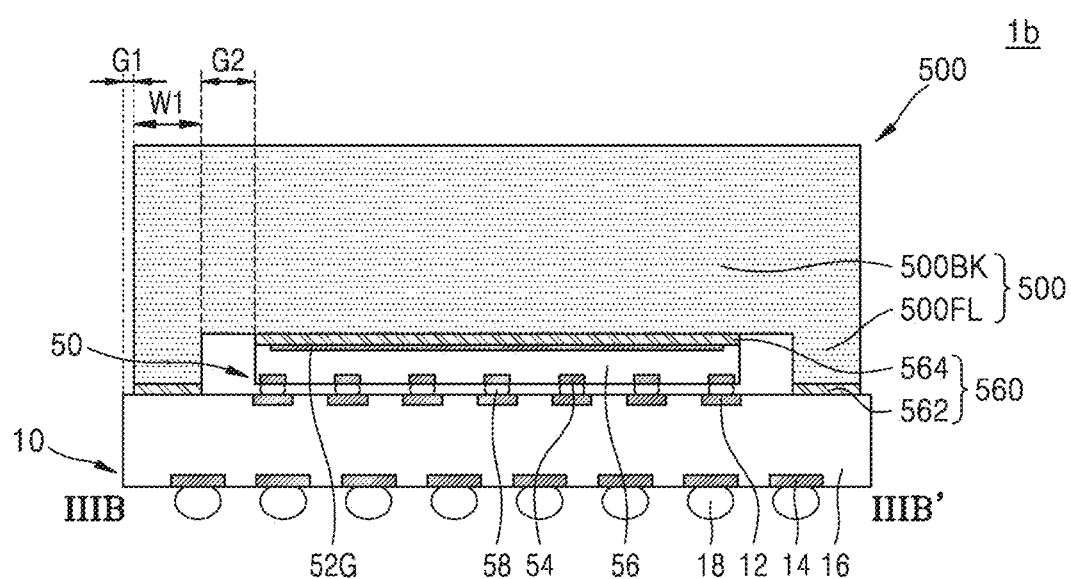
FIG. 3B is a cross-sectional view of the semiconductor package of FIG. 3A.

FIG. 3A is a plan layout of a semiconductor package 1b according to an example embodiment of the inventive concepts, and FIG. 3B is a cross-sectional view of a semiconductor package 1b. In particular, FIG. 3B is a cross-sectional view taken along line IIIB-IIIB' of FIG. 3A. In FIGS. 3A and 3B, the same reference numerals as those of FIGS. 1A to 2 refer to the same elements, and redundant descriptions thereof are omitted.

Referring to FIGS. 3A and 3B, the semiconductor package 1b may include the package base substrate 10, the interposer 50 and the stiffener structure 500b that are on the package base substrate 10, and the plurality of memory stacks 300 and the logic semiconductor chip 400 that are on the interposer 50.

The stiffener structure 500b may include the stiffener film 500FL, the stiffener extension portion 500ET, and a stiffener block 500BK. The stiffener film 500FL, the stiffener extension portion 500ET, and the stiffener block 500BK may be integrally formed. The interposer thermal interface material layer 564 may be on a portion of a lower surface of each of the stiffener extension portion 500ET and the stiffener block 500BK, and the stiffener extension portion 500ET and the stiffener block 500BK may be on the interposer 50 with the interposer thermal interface material layer 564 therebetween. The stiffener extension portion 500ET and the stiffener block 500BK may overlap the ground pad 52G in the vertical direction.

The stiffener film 500FL may extend along the edge of the package base substrate 10 and have a rectangular ring shape surrounding the interposer 50. The stiffener film 500FL may have a shape in which four sidewalls thereof extending along four edges of the package base substrate 10, respectively, are connected to each other.

The stiffener block 500BK may extend from a portion of the stiffener film 500FL onto the interposer 50, and may be apart from the package base substrate 10. The stiffener block 500BK may extend from one sidewall among the four sidewalls of the stiffener film 500FL, along two other sidewalls adjacent the one sidewall, and may extend to a portion adjacent to the edge of the interposer 50. For example, the stiffener block 500BK may extend from a portion adjacent to the edge of the interposer 50 on a side opposite to the logic semiconductor chip 400 based on the two memory stacks 300 to one sidewall of the stiffener block 500BK. The stiffener block 500BK may have a rectangular shape in a plan view. The stiffener block 500BK may entirely contact one sidewall of the four sidewalls of the stiffener film 500FL and may contact a portion of two other sidewalls adjacent to the one sidewall. The stiffener block 500BK may be referred to as the stiffener bridge 500BR, as shown in FIG. 2, because the stiffener block 500BK extends between two opposing sidewalls among the four sidewalls of the stiffener film 500FL and extends from and connected to another sidewall of the stiffener film 500FL.

The stiffener extension portion 500ET may extend from the stiffener film 500FL onto the interposer 50, and may be apart from the package base substrate 10. The stiffener extension portion 500ET may extend between two memory stacks 300, which are adjacent to each other.

The stiffener extension portion 500ET may extend by penetrating the stiffener block 500BK. A portion of the stiffener block 500BK through which the stiffener extension portion 500ET penetrates may be a portion of the stiffener extension portion 500ET and a portion of the stiffener block 500BK.

In some example embodiments, the stiffener structure 500b may include the stiffener film 500FL extending along the edge of the package base substrate 10 and having a rectangular ring shape surrounding the interposer 50, two stiffener extension portions 500ET each extending from the stiffener film 500FL onto the interposer 50, and two stiffener blocks 500BK each extending from a corresponding one of two opposing sidewalls among the four sidewalls of the stiffener film 500FL onto the interposer 50. Each of the two stiffener extension portions 500ET may penetrate a different stiffener block 500BK from among the two stiffener blocks 500BK.

The semiconductor package 1b according to the example embodiment may include the stiffener structure 500b including the stiffener film 500FL being in contact with or adjacent to the edge of the package base substrate 10 and extending along the edge of the package base substrate 10, the stiffener extension portion 500ET extending from the stiffener film 500FL onto the interposer 50 and extending between two memory stacks 300 arranged adjacently, and the stiffener block 500BK extending from the sidewall of the stiffener film 500FL onto the interposer 50. Accordingly, heat generated by the plurality of semiconductor chips may be emitted to the outside through the stiffener structure 500b, and the stiffener film 500FL on the package base substrate 10 are integrally formed with the stiffener extension portion 500ET and the stiffener block 500BK on the interposer 50, and thus, the semiconductor package 1b may be mitigated or prevented from being bent.

FIGS. 4 to 11 are each a plan layout of a semiconductor package according to some example embodiments of the inventive concepts. In FIGS. 4 to 11, the reference numerals as those of FIGS. 1A to 3B refer to the elements, and redundant descriptions thereof are omitted.

Figure 4:
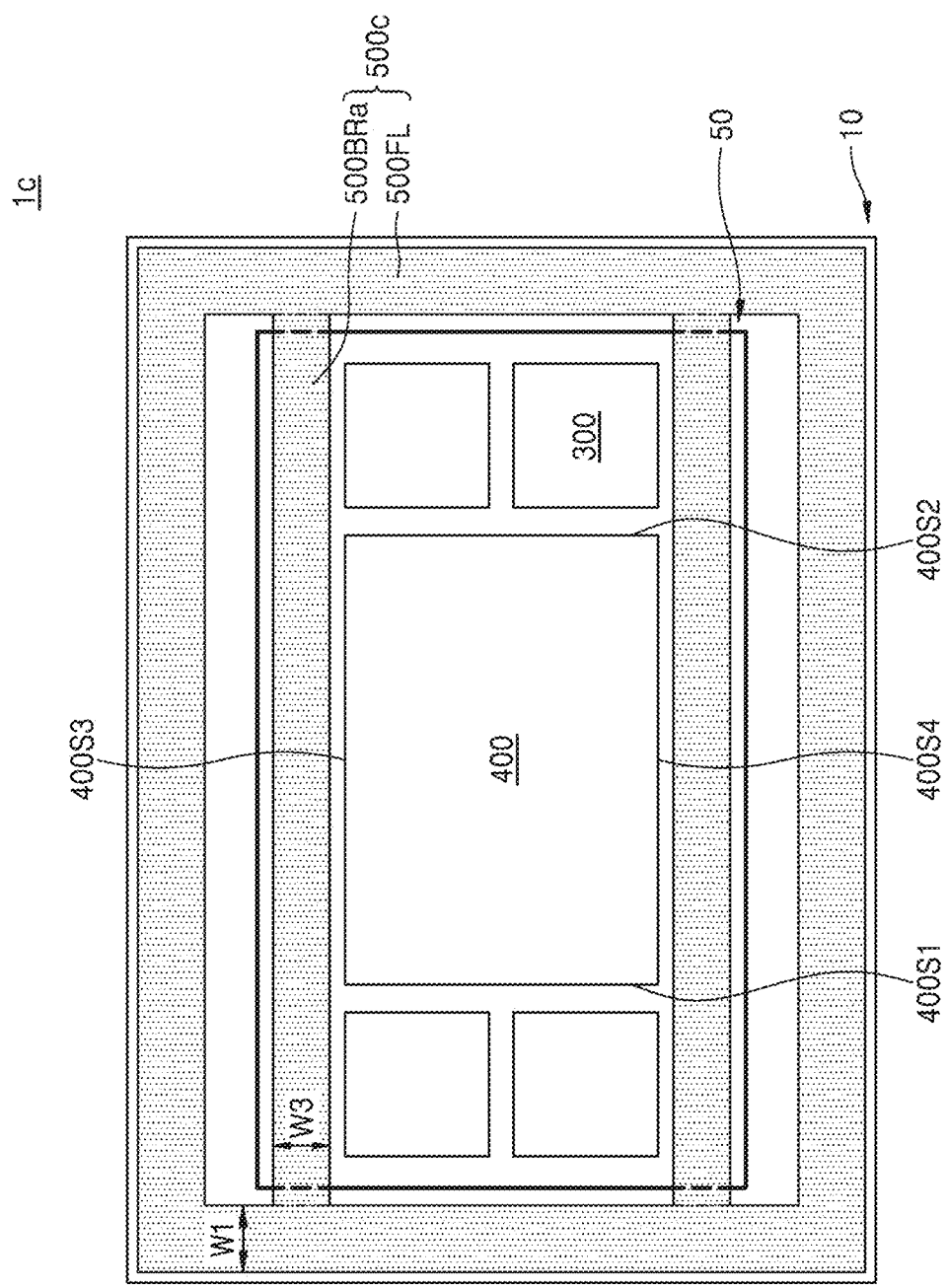
FIGS. 4 to 11 are each a plan layout of a semiconductor package according to some example embodiments of the inventive concepts.

Referring to FIG. 4, a semiconductor package 1c may include the package base substrate 10, the interposer 50 and a stiffener structure 500c that are on the package base substrate 10, and the plurality of memory stacks 300 and the logic semiconductor chip 400 that are on the interposer 50.

The stiffener structure 500c may include the stiffener film 500FL and a stiffener bridge 500BRa. The stiffener film 500FL may be integrally formed with the stiffener bridge 500BRa. The interposer thermal interface material layer 564 as shown in FIGS. 1B to 1D may be on a portion of a lower surface of the stiffener bridge 500BRa, and the stiffener bridge 500BRa may be on the interposer 50 with the interposer thermal interface material layer 564 therebetween. Further, the stiffener bridge 500BRa may overlap the ground pad 52G as shown in FIGS. 1B to 1D in the vertical direction.

The stiffener bridge 500BRa may extend between two opposing sidewalls among the four sidewalls of the stiffener film 500FL, and may extend along a portion adjacent to the edge of the interposer 50. For example, the stiffener bridge 500BRa may extend along a third edge 400S3 and a fourth edge 400S4, which are two opposite edges different from two edges of the logic semiconductor chip 400 that face the memory stack 300, and may be connected to the two opposing sidewalls among the four sidewalls of the stiffener film 500FL. The stiffener bridge 500BRa may extend with the third width W3. For example, an extension direction of the stiffener bridge 500BRa shown in FIG. 4 and the extension direction of the stiffener bridge 500BR shown in FIG. 2 may be orthogonal to each other.

In some example embodiments, the stiffener structure 500c may include the stiffener film 500FL extending along the edge of the package base substrate 10 and having a rectangular ring shape surrounding the interposer 50, and two stiffener bridges 500BRa extending between two opposing sidewalls among the four sidewalls of the stiffener film 500FL from the stiffener film 500FL and extending along portions adjacent to two opposite edges among the four edges of the interposer 50, respectively. An extension direction of each of the two stiffener bridges 500BRa may be a direction toward the memory stack 300 based on the logic semiconductor chip 400.

Figure 5:
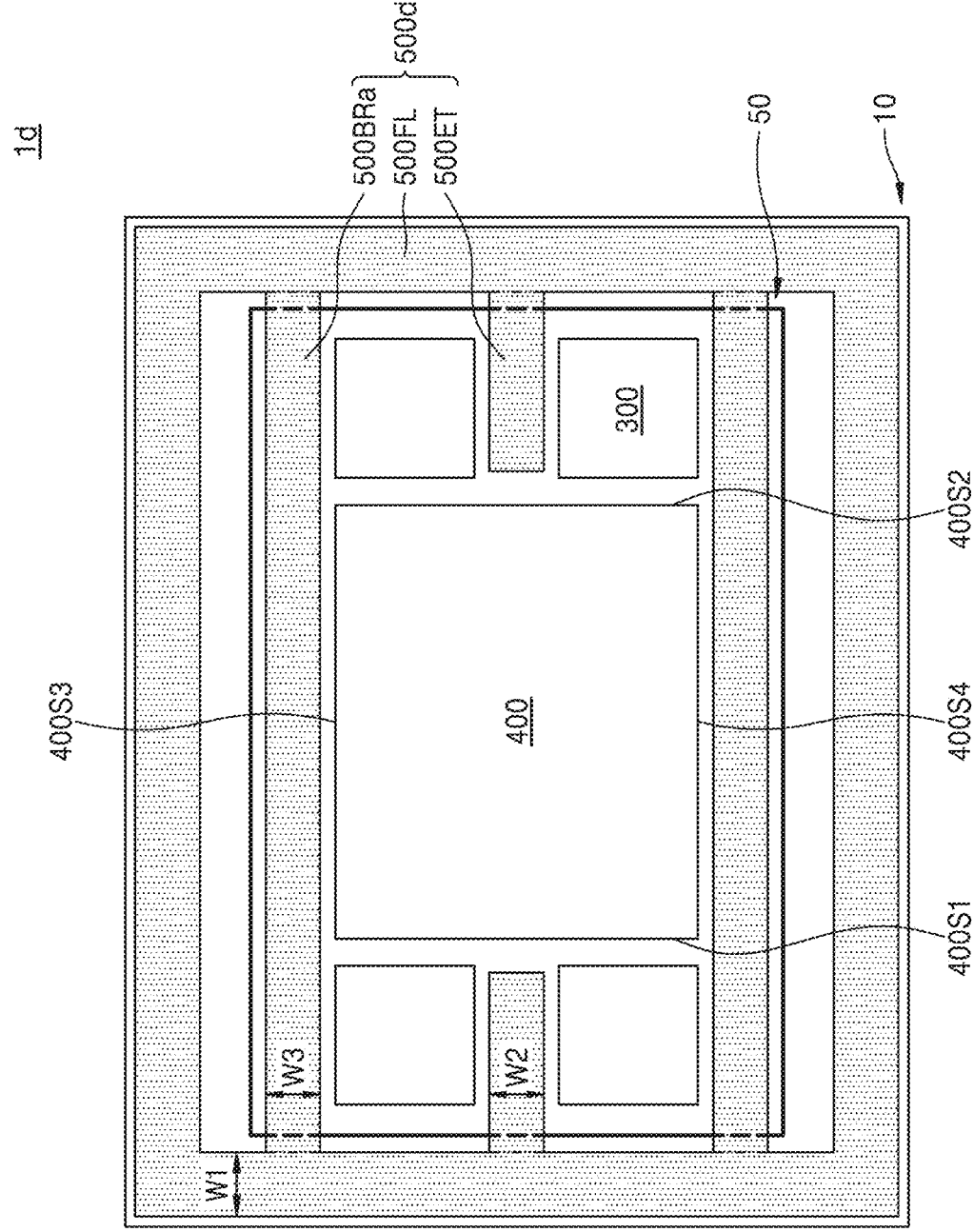

Referring to FIG. 5, a semiconductor package 1d may include the package base substrate 10, the interposer 50 and a stiffener structure 500d that are on the package base substrate 10, the plurality of memory stacks 300 and the logic semiconductor chip 400 that are on the interposer 50.

The stiffener structure 500d may include the stiffener film 500FL, the stiffener extension portion 500ET, and the stiffener bridge 500BRa. The stiffener film 500FL, the stiffener extension portion 500ET, and the stiffener bridge 500BRa may be integrally formed. The interposer thermal interface material layer 564 as shown in FIGS. 1B to 1D may be on a portion of a lower surface of each of the stiffener extension portion 500ET and the stiffener bridge 500BRa, and the stiffener extension portion 500ET and the stiffener bridge 500BRa may be on the interposer 50 with the interposer thermal interface material layer 564 therebetween. Further, the stiffener extension portion 500ET and the stiffener bridge 500BRa may overlap the ground pad 52G as shown in FIGS. 1B to 1D in the vertical direction.

The stiffener extension portion 500ET may extend from the stiffener film 500FL onto the interposer 50, and may be apart from the package base substrate 10. The stiffener extension portion 500ET may extend between two memory stacks 300, which are adjacent to each other.

The stiffener bridge 500BRa may extend between two opposing sidewalls among the four sidewalls of the stiffener film 500FL, and may extend along a portion adjacent to the edge of the interposer 50. For example, the stiffener bridge 500BRa may extend in the same direction as the stiffener film 500FL along the third edge 400S3 and the fourth edge 400S4, which are two opposite edges of the logic semiconductor chip 400. The stiffener bridge 500BRa may be connected to two opposing sidewalls among the four sidewalls of the stiffener film 500FL. The stiffener extension portion 500ET may extend with the second width W2, and the stiffener bridge 500BRa may extend with a third width W3. The second width W2 may be equal to or similar to the third width W3.

In some example embodiments, the stiffener structure 500d may include the stiffener film 500FL extending along the edge of the package base substrate 10 and having a rectangular ring shape surrounding the interposer 50, two stiffener extension portions 500ET each extending from the stiffener film 500FL onto the interposer 50, and two stiffener bridges 500BRa each extending between two opposing sidewalls among the four sidewalls of the stiffener film 500FL and extending along portions adjacent to each of two opposing edges among the four edges of the interposer 50. The two stiffener extension portions 500ET and the two stiffener bridges 500BRa may extend in the same direction.

Figure 6:
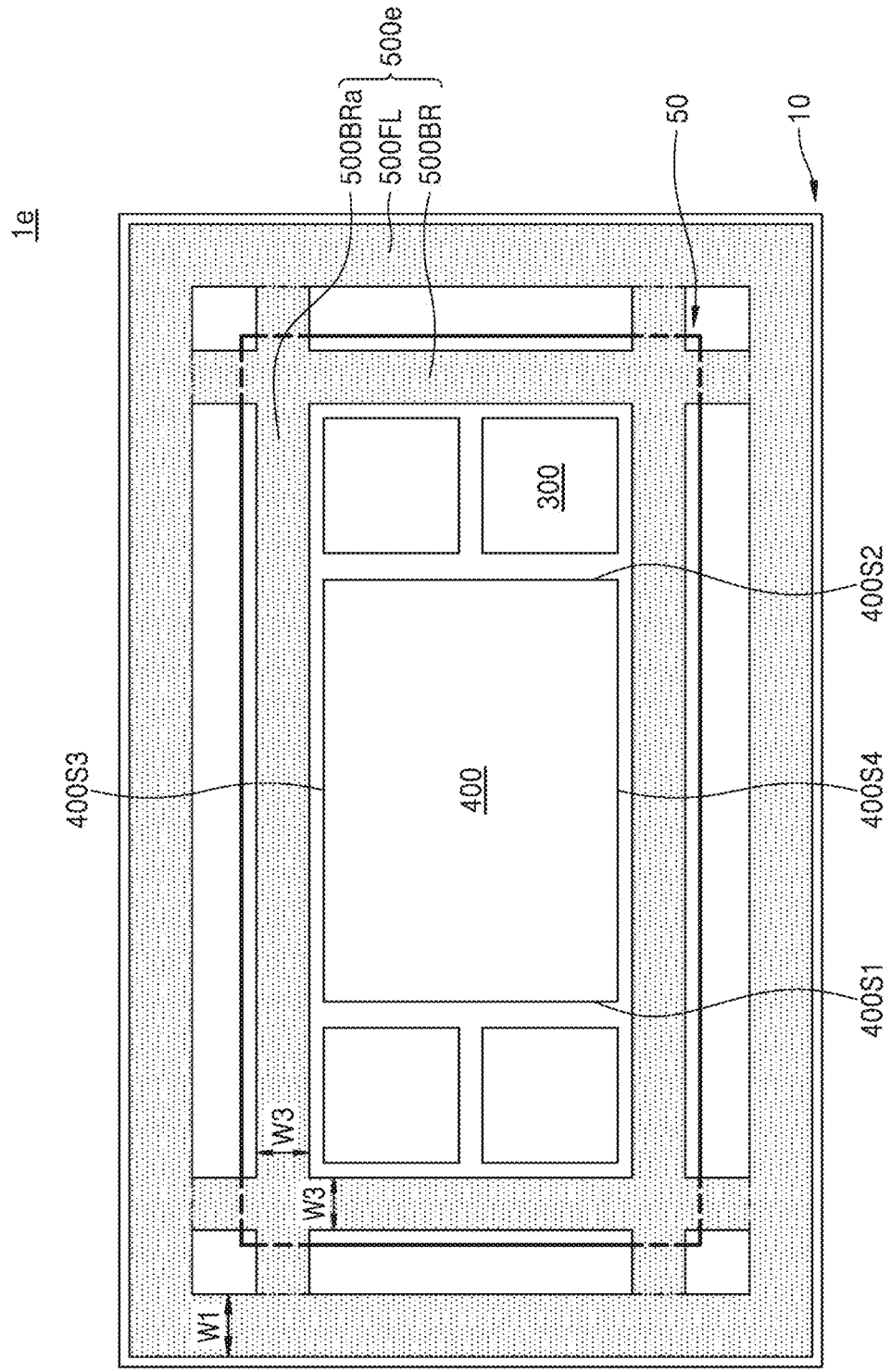

Referring to FIG. 6, a semiconductor package 1e may include the package base substrate 10, the interposer 50 and a stiffener structure 500e that are on the package base substrate 10, and the plurality of memory stacks 300 and the logic semiconductor chip 400 that are on the interposer 50.

The stiffener structure 500e may include the stiffener film 500FL, a first stiffener bridge 500BR, and a second stiffener bridge 500BRa. The stiffener film 500FL, the first stiffener bridge 500BR, and the second stiffener bridge 500BRa may be integrally formed. The first stiffener bridge 500BR may be the same as or substantially similar to the stiffener bridge 500BR shown in FIG. 2, and the second stiffener bridge 500BRa may be the same as or substantially similar to the stiffener bridge 500BRa shown in FIG. 4, and thus detailed descriptions thereof will be omitted.

The first stiffener bridge 500BR and the second stiffener bridge 500BRa may extend by intersecting with each other. For example, an extension direction of the first stiffener bridge 500BR and an extension direction of the second stiffener bridge 500BRa may be orthogonal to each other. A portion where the first stiffener bridge 500BR and the second stiffener bridge 500BRa intersect may be a portion of the first stiffener bridge 500BR and a portion of the second stiffener bridge 500BRa. The portion where the first stiffener bridge 500BR and the second stiffener bridge 500BRa intersect may be positioned on the interposer 50. That is, the portion where the first stiffener bridge 500BR and the second stiffener bridge 500BRa intersect may overlap the interposer 50 in the vertical direction. Each of the first stiffener bridge 500BR and the second stiffener bridge 500BRa may extend with the third width W3.

In some example embodiments, the stiffener structure 500e may include the stiffener film 500FL, two first stiffener bridges 500BR, and two second stiffener bridges 500BRa.

Figure 7:
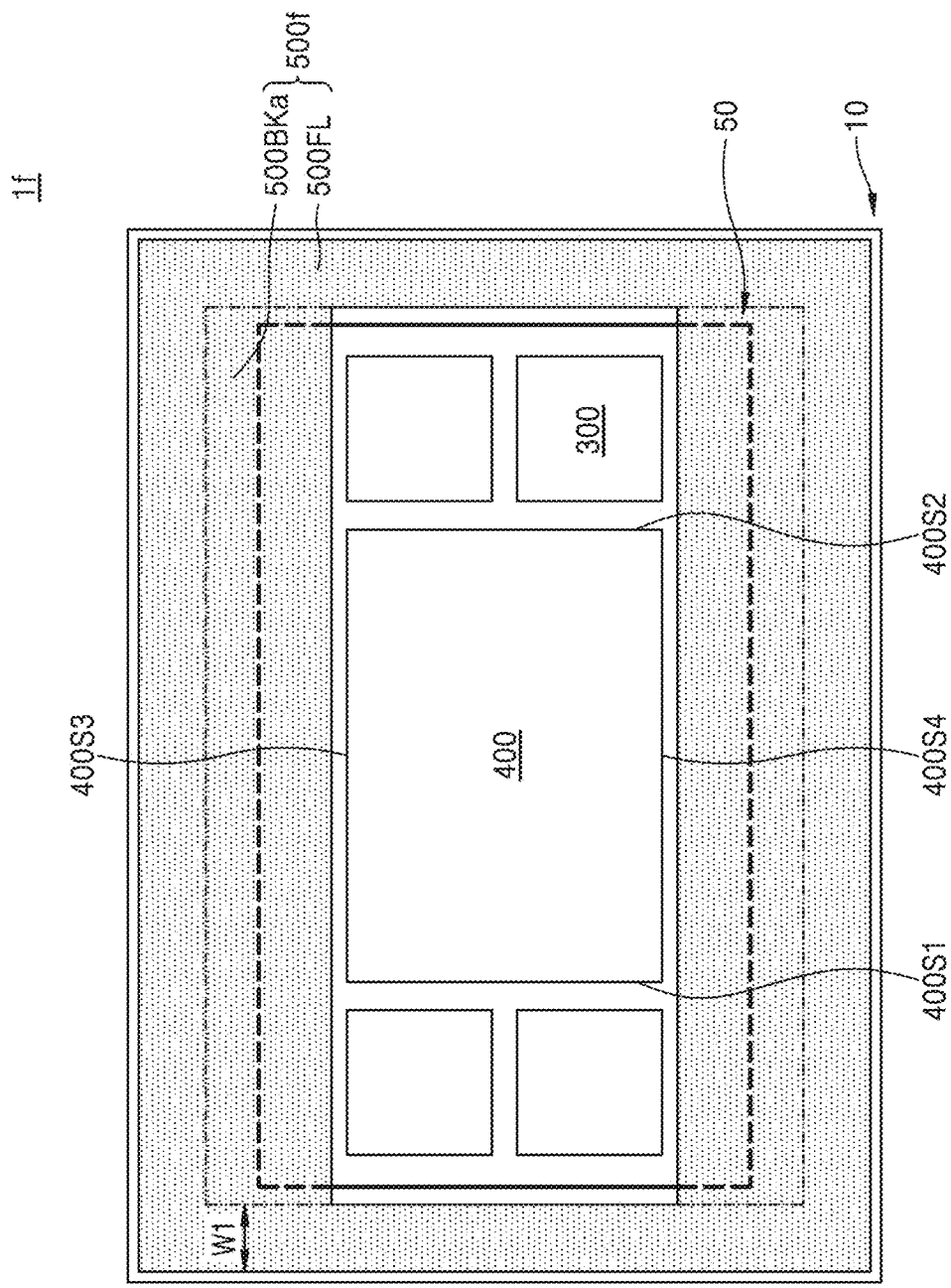

Referring to FIG. 7, a semiconductor package 1f may include the package base substrate 10, the interposer 50 and a stiffener structure 500f that are on the package base substrate 10, the plurality of memory stacks 300 and the logic semiconductor chip 400 that are on the interposer 50.

The stiffener structure 500f may include the stiffener film 500FL and a stiffener block 500BKa. The stiffener film 500FL may be integrally formed with the stiffener block 500BKa. The interposer thermal interface material layer 564 as shown in FIGS. 1B to 1D may be on a portion of a lower surface of the stiffener block 500BKa, and the stiffener block 500BKa may be on the interposer 50 with the interposer thermal interface material layer 564 therebetween. Further, the stiffener block 500BKa may overlap the ground pad 52G as shown in FIGS. 1B to 1D in the vertical direction.

The stiffener film 500FL may extend along the edge of the package base substrate 10 and have a rectangular ring shape surrounding the interposer 50. The stiffener film 500FL may have a shape in which four sidewalls thereof extending along four edges of the package base substrate 10, respectively, are connected to each other.

The stiffener block 500BKa may extend from a portion of the stiffener film 500FL onto the interposer 50, and may be apart from the package base substrate 10. The stiffener block 500BKa may extend from one sidewall among the four sidewalls of the stiffener film 500FL along two other sidewalls adjacent the one sidewall, and may extend to a portion adjacent to the edge of the interposer 50. For example, the stiffener block 500BKa may extend from one sidewall among the four sidewalls of the stiffener film 500FL onto the interposer 50 to be adjacent to a corresponding one of the third edge 400S3 and the fourth edge 400S4, which are two opposite edges of the logic semiconductor chip 400. The stiffener block 500BKa may have a rectangular shape in a plan view. The stiffener block 500BKa may entirely contact one sidewall of the four sidewalls of the stiffener film 500FL and may contact a portion of two other sidewalls adjacent to the one sidewall.

In some example embodiments, the stiffener structure 500f may include the stiffener film 500FL and two stiffener blocks 500BKa extending from two opposing sidewalls among the four sidewalls of the stiffener film 500FL onto the interposer 50.

Figure 8:
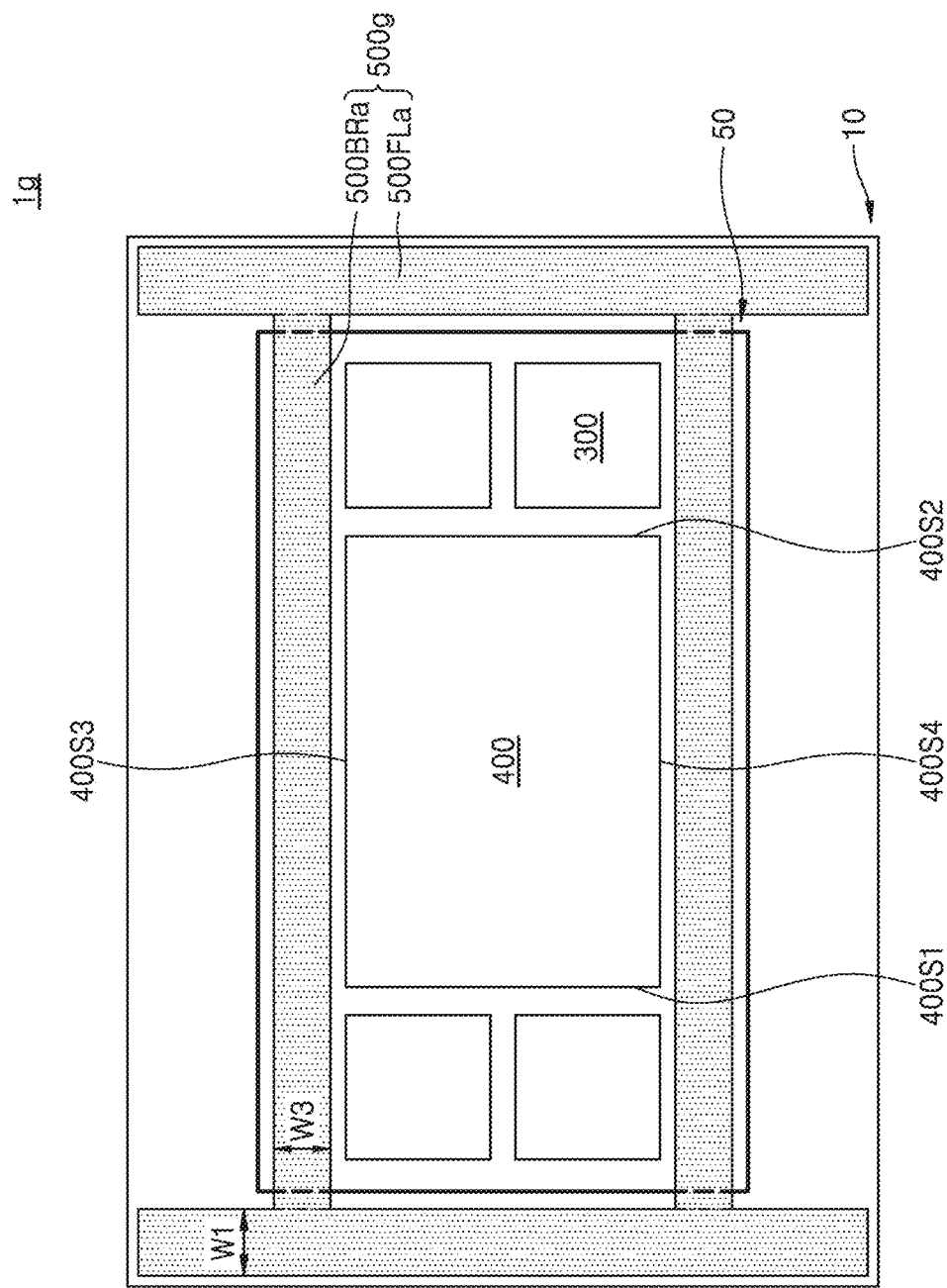

Referring to FIG. 8, a semiconductor package 1g may include the package base substrate 10, the interposer 50 and the stiffener structure 500g that are on the package base substrate 10, and the plurality of memory stacks 300 and the logic semiconductor chip 400 that are on the interposer 50.

The stiffener structure 500g may include a stiffener frame (interchangeably referred to as "stiffener film") 500FLa and the stiffener bridge 500BRa. The stiffener frame 500FLa may be integrally formed with the stiffener bridge 500BRa. The stiffener bridge 500BRa may be the same as or substantially similar to the stiffener bridge 500BRa of FIG. 4, and thus a detailed description thereof is omitted.

The stiffener frame 500FLa may have a bar shape extending along the edge of the package base substrate 10. For example, the stiffener frame 500FLa may be apart from an edge of the interposer 50 on a side opposite to the logic semiconductor chip 400 based on the memory stack 300, and may extend along the edge of the interposer 50. The substrate thermal interface material layer 562 as shown in FIGS. 1B to 1D may be on a lower surface of the stiffener frame 500FLa, and the stiffener frame 500FLa may be on the package base substrate 10 with the substrate thermal interface material layer 562 therebetween.

In some example embodiments, the stiffener frame 500FLa may have two stiffener frames extending along two opposite edges among the four edges of the interposer 50 and being apart from each other, and the stiffener bridge 500BRa may have two stiffener bridges connected to the two stiffener frames 500FLa and being apart from each other. An extension direction of the stiffener frame 500FLa and an extension direction of the stiffener bridge 500BRa may be orthogonal to each other.

Figure 9:
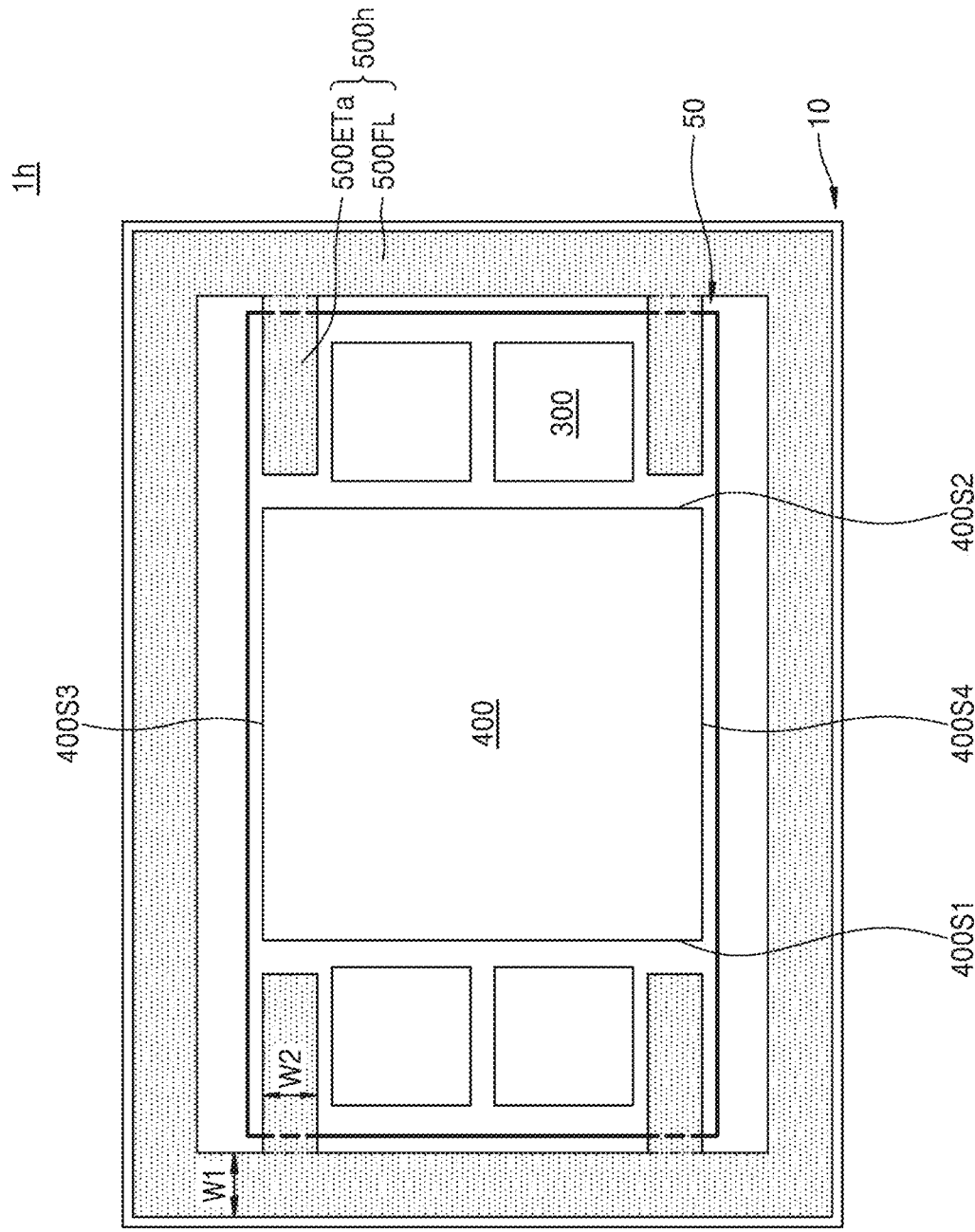

Referring to FIG. 9, a semiconductor package 1h may include the package base substrate 10, the interposer 50 and a stiffener structure 500h that are on the package base substrate 10, the plurality of memory stacks 300 and the logic semiconductor chip 400 that are on the interposer 50.

The stiffener structure 500h may include the stiffener film 500FL and a stiffener extension portion 500ETa. The stiffener film 500FL may be integrally formed with the stiffener extension portion 500ETa. The interposer thermal interface material layer 564 as shown in FIGS. 1B to 1D may be on a portion of a lower surface of the stiffener extension portion 500ETa, and the stiffener extension portion 500ETa may be on the interposer 50 with the interposer thermal interface material layer 564 therebetween. The stiffener extension portion 500ETa may extend with the second width W2.

The stiffener extension portion 500ETa may extend from the stiffener film 500FL onto the interposer 50, and may be apart from the package base substrate 10. The stiffener extension portion 500ETa may extend around the two memory stacks 300, which are adjacent to each other toward the logic semiconductor chip 400.

In some example embodiments, the stiffener structure 500h may include the stiffener film 500FL and four stiffener extension portions 500Eta, which include two stiffener extension portions 500ETa extending around the two memory stacks 300 adjacent to the first edge 400S1 of the logic semiconductor chip 400 and two other stiffener extension portions 500ETa extending around two other memory stacks 300 adjacent to the second edge 400S2 of the logic semiconductor chip 400.

Figure 10:
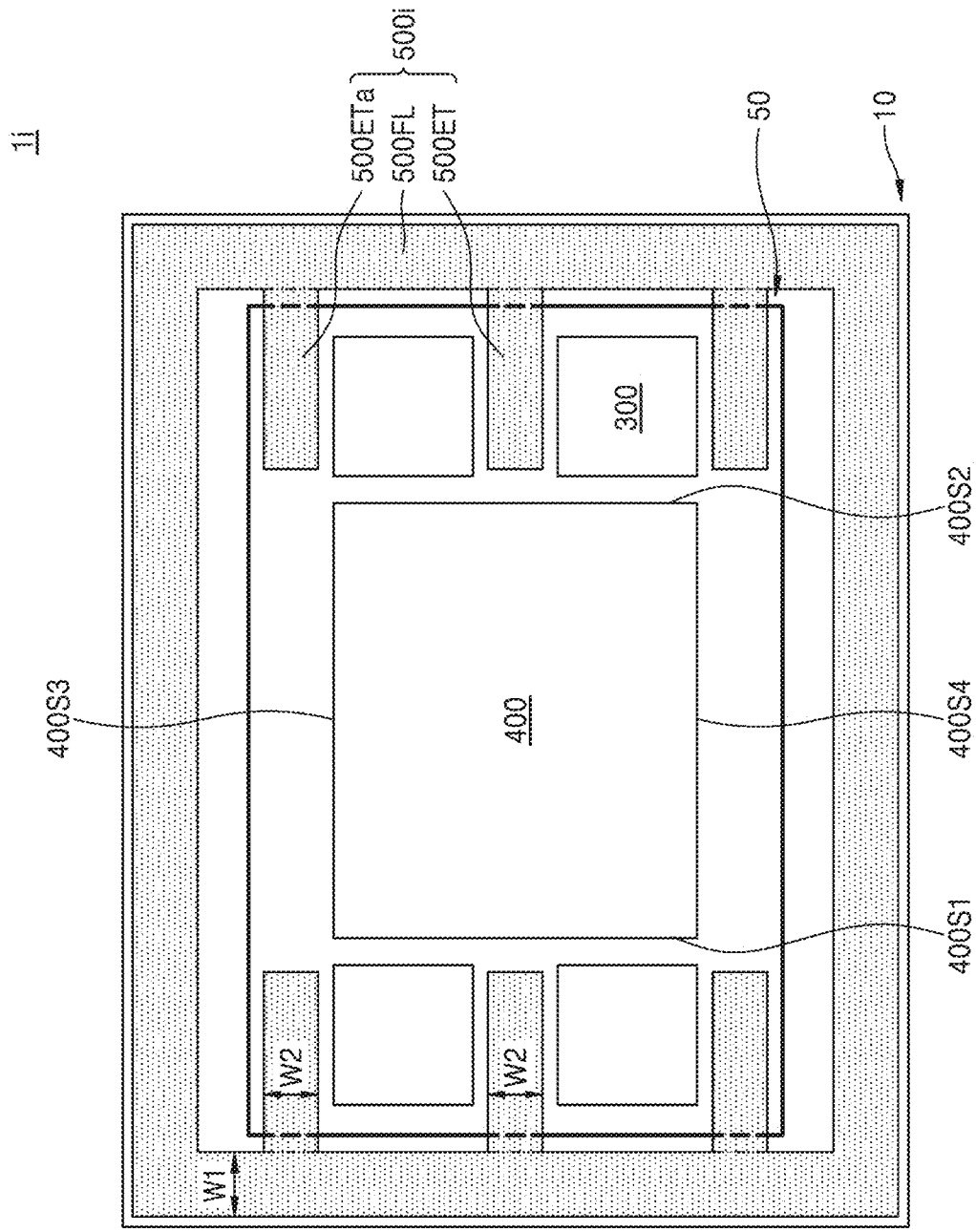

Referring to FIG. 10, a semiconductor package 1i may include the package base substrate 10, the interposer 50 and a stiffener structure 500i that are on the package base substrate 10, and the plurality of memory stacks 300 and the logic semiconductor chip 400 that are on the interposer 50.

The stiffener structure 500h may include the stiffener structure 500h, a first stiffener extension portion 500ET, and a second stiffener extension portion 500ETa. The stiffener film 500FL, the first stiffener extension portion 500ET, and the second stiffener extension portion 500ETa may be integrally formed. The first stiffener extension portion 500ET may be the same as or substantially similar to the stiffener extension portion 500ET shown in FIGS. 1A and 1C, and the second stiffener extension portion 500ETa may be the same as or substantially similar to the stiffener extension portion 500ETa shown in FIG. 9, and thus detailed descriptions thereof will be omitted. An extension direction of the first stiffener extension portion 500ET and an extension direction of the second stiffener extension portion 500ETa may be the same direction.

In some example embodiments, the stiffener structure 500i may include the stiffener film 500FL, two first stiffener extension portions 500ET, and four second stiffener extension portions 500ETa.

Figure 11:
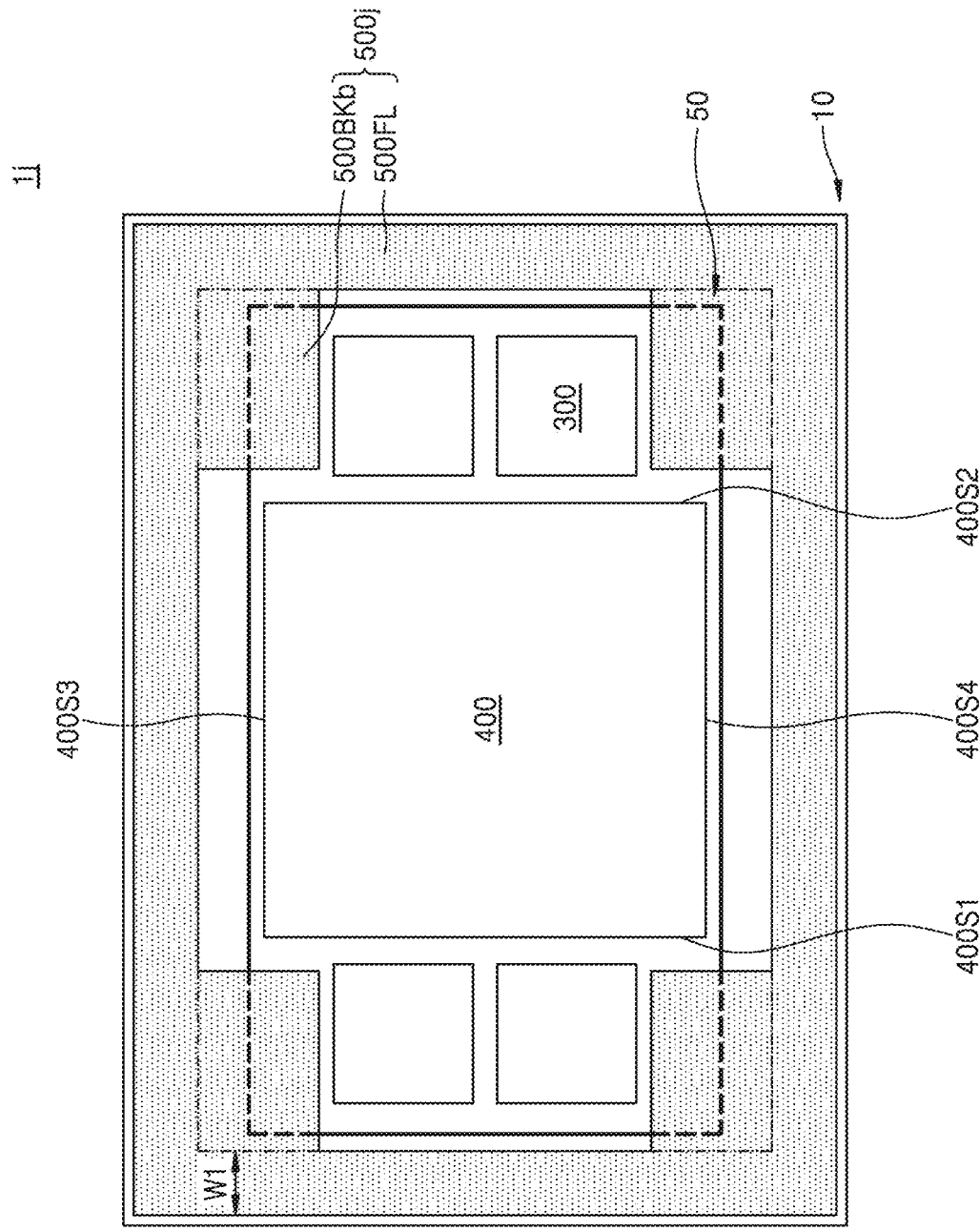

Referring to FIG. 11, a semiconductor package 1j may include the package base substrate 10, the interposer 50 and a stiffener structure 500j that are on the package base substrate 10, and the plurality of memory stacks 300 and the logic semiconductor chip 400 that are on the interposer 50.

The stiffener structure 500j may include the stiffener film 500FL and a stiffener block 500BKb. The stiffener film 500FL may be integrally formed with the stiffener block 500BKb. The interposer thermal interface material layer 564 as shown in FIGS. 1B to 1D may be on a portion of a lower surface of the stiffener block 500BKb, and the stiffener block 500BKb may be on the interposer 50 with the interposer thermal interface material layer 564 therebetween. Further, the stiffener block 500BKb may overlap the ground pad 52G as shown in FIGS. 1B to 1D in the vertical direction.

The stiffener block 500BKb may extend from an inner corner of the stiffener film 500FL between two sidewalls connected to each other among the four sidewalls of the stiffener film 500FL to a portion adjacent to the inner corner onto the interposer 50, and may be apart from the package base substrate 10. The stiffener block 500BKb may have a rectangular shape in a plan view. The stiffener block 500BKb may contact a portion of the two sidewalls connected to each other among the four sidewalls of the stiffener film 500FL.

In some example embodiments, the stiffener structure 500j may include the stiffener film 500FL and four stiffener blocks 500BKb respectively in contact with four inner corners of the stiffener film 500FL and portions adjacent to the four inner corners.

Figure 12:
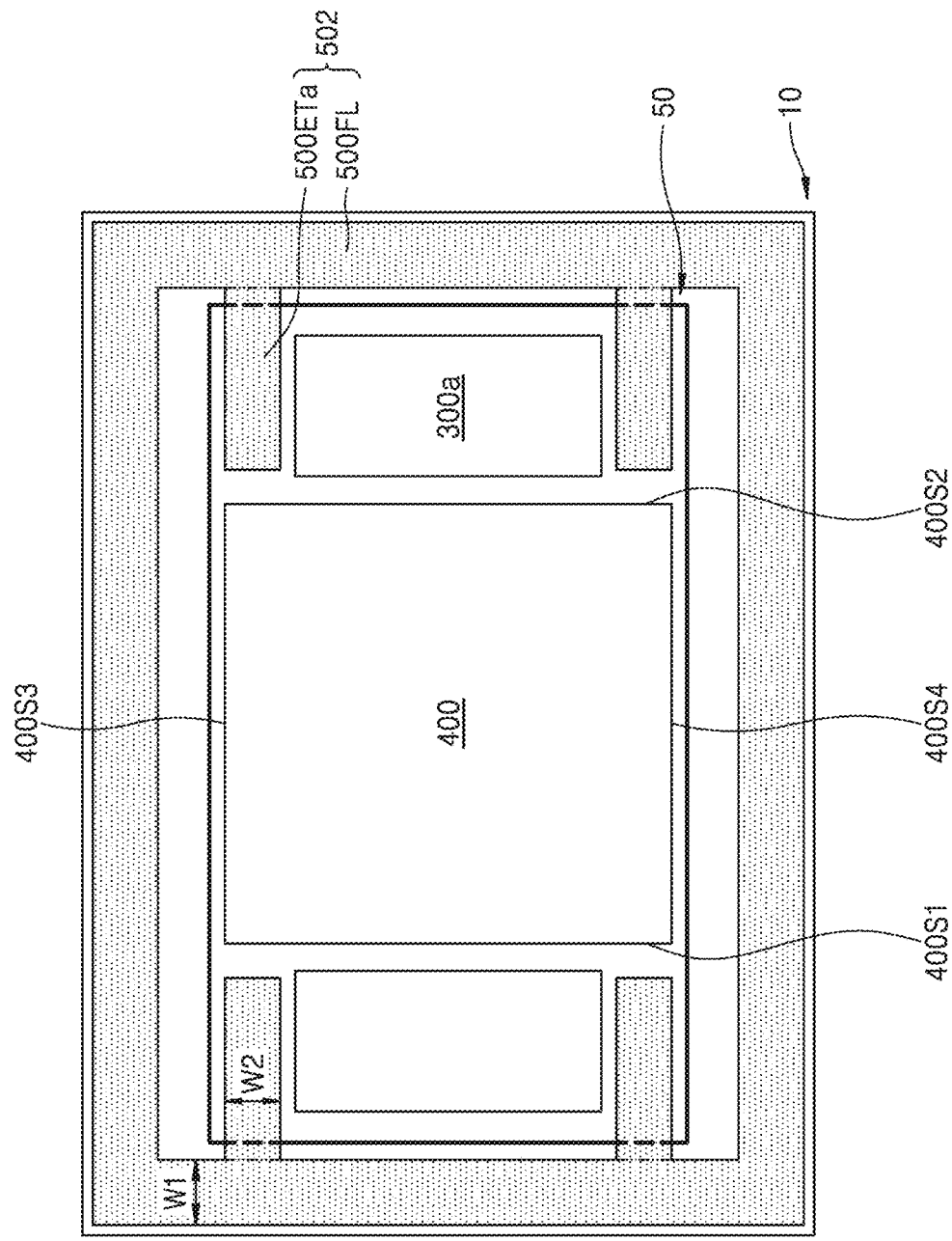
FIG. 12 is a plan layout of a semiconductor package according to an example embodiment of the inventive concepts.

FIG. 12 is a plan layout of a semiconductor package 2 according to an example embodiment of the inventive concepts. In FIG. 12, the same reference numerals as those of FIGS. 1A to 11 refer to the same elements, and redundant descriptions thereof are omitted.

Referring to FIG. 12, the semiconductor package 2 may include the package base substrate 10, the interposer 50 and a stiffener structure 502 that are on the package base substrate 10, and a plurality of memory stacks 300a and the logic semiconductor chip 400 that are on the interposer 50.

In some example embodiments, the semiconductor package 2 includes two memory stacks 300a and one logic semiconductor chip 400. The two memory stacks 300a may be arranged adjacent to both sides of the one logic semiconductor chip 400, that is, the two memory stacks 300a may be arranged adjacent to the first edge 400S1 and the second edge 400S2, respectively, which are two opposite edges among the four edges of the logic semiconductor chip 400. The memory stack 300a may be the same as or substantially similar to the memory stack 300 shown in FIGS. 1A to 11, and thus a detailed description thereof is omitted.

The stiffener structure 502 may include the stiffener film 500FL and the stiffener extension portion 500ETa. The stiffener film 500FL may be integrally formed with the stiffener extension portion 500ETa. The stiffener extension portion 500ETa may be the same as or substantially similar to the stiffener extension portion 500ETa shown in FIG. 9, and thus a detailed description thereof is omitted.

The stiffener extension portion 500ETa may extend from the stiffener film 500FL onto the interposer 50, and may be apart from the package base substrate 10. A pair of the stiffener extension portions 500ETa may extend along both sides of a corresponding one of the plurality of memory stacks 300a toward the logic semiconductor chip 400.

In some example embodiments, the stiffener structure 502 may include the stiffener film 500FL and four stiffener extension portions 500ETa which include two stiffener extension portions 500ETa extending around the memory stack 300a adjacent to the first edge 400S1 of the logic semiconductor chip 400 and two other stiffener extension portions 500ETa extending around other memory stack 300a adjacent to the second edge 400S2 of the logic semiconductor chip 400.

FIGS. 13 to 16 are each a plan layout of a semiconductor package according to some example embodiments of the inventive concepts. In FIGS. 13 to 16, the same reference numerals as those of FIGS. 1A to 12 refer to the same elements, and redundant descriptions thereof are omitted. Semiconductor packages 3, 3a, 3b, and 3c shown in FIGS. 13 to 16 are shown rotated 90 degrees compared to the semiconductor packages 1, 1a, 1b, 1c, 1d, 1e, 1f, 1g, 1h, 1i, 1j, and 2 shown in FIGS. 1A to 12, for convenience of illustration.

Figure 13:
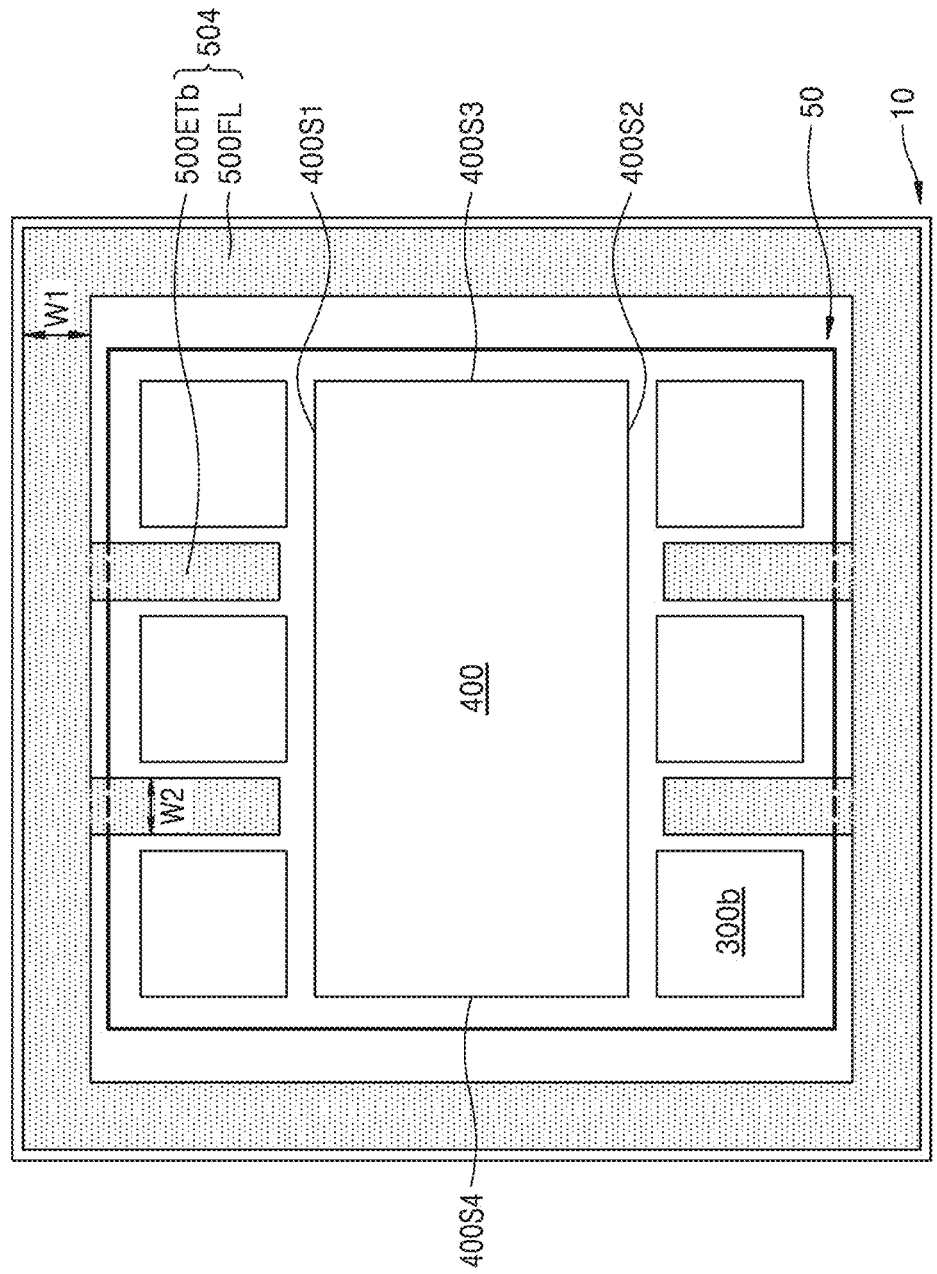
FIGS. 13 to 16 are each a plan layout of a semiconductor package according to some example embodiments of the inventive concepts.

Referring to FIG. 13, the semiconductor package 3 may include the package base substrate 10, the interposer 50 and a stiffener structure 504 that are on the package base substrate 10, and a plurality of memory stacks 300b and the logic semiconductor chip 400 that are on the interposer 50.

In some example embodiments, the semiconductor package 3 may include six memory stacks 300b and one logic semiconductor chip 400. The six memory stacks 300b may be arranged adjacent to both sides of the logic semiconductor chip 400, that is, three of the six memory stacks 300b may be arranged adjacent to each of the first edge 400S1 and the second edge 400S2, which are two opposite edges among the four edges of the logic semiconductor chip 400. The memory stack 300b may be the same as or substantially similar to the memory stack 300 shown in FIGS. 1A to 11, and thus a detailed description thereof is omitted.

The stiffener structure 504 may include the stiffener film 500FL and a stiffener extension portion 500ETb. The stiffener film 500FL may be integrally formed with the stiffener extension portion 500ETb. The stiffener extension portion 500ETb may be the same as or substantially similar to the stiffener extension portion 500ET shown in FIGS. 1A and 1C, and thus a detailed description thereof is omitted.

In some example embodiments, the stiffener structure 504 may include the stiffener film 500FL, and four stiffener extension portions 500ETb extending from the stiffener film 500FL onto the interposer 50.

The stiffener extension portions 500ETb may extend between three memory stacks 300b arranged adjacent to each of the first edge 400S1 and the second edge 400S2 of the logic semiconductor chip 400.

Figure 14:
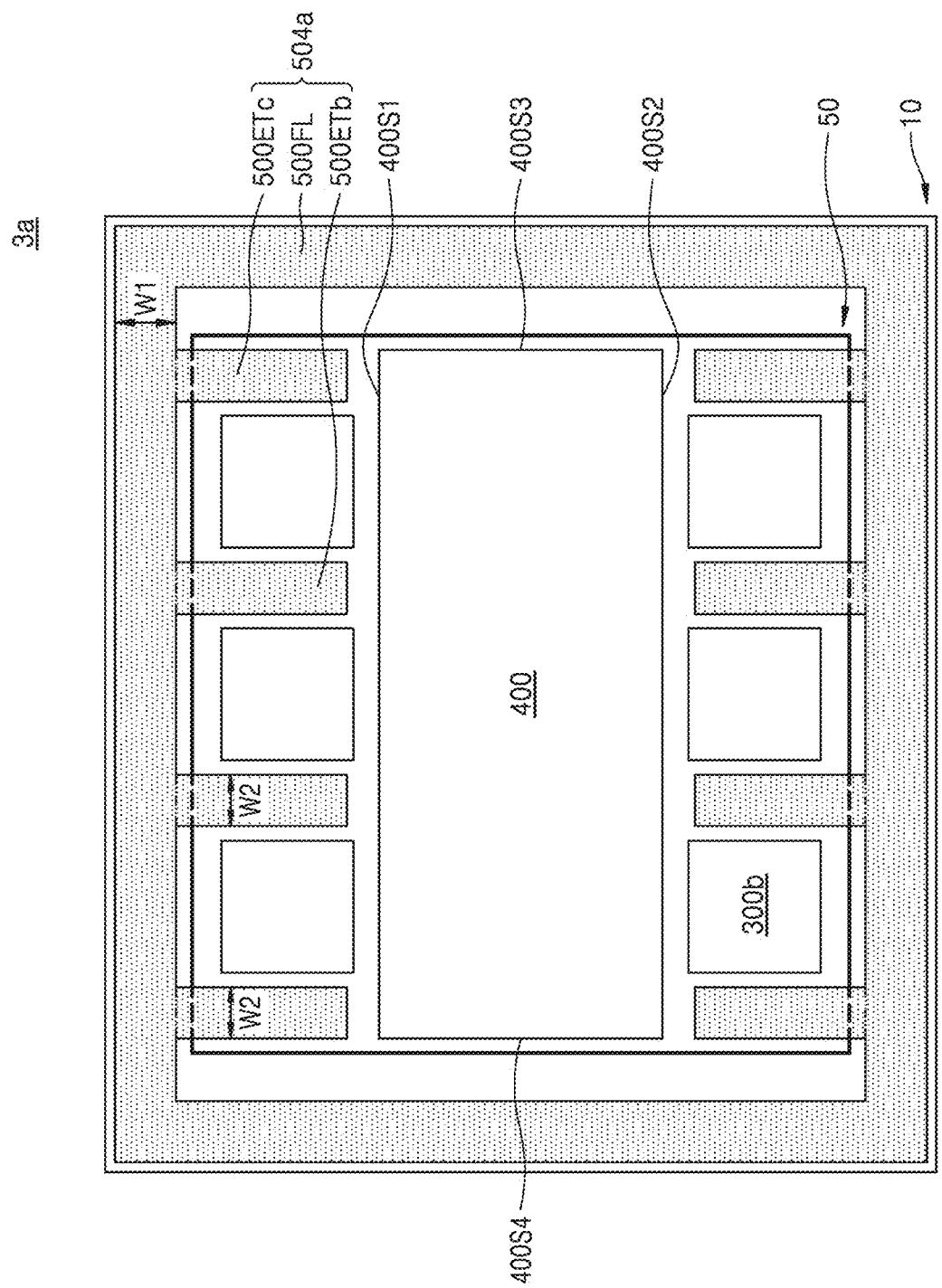

Referring to FIG. 14, the semiconductor package 3a may include the package base substrate 10, the interposer 50 and a stiffener structure 504a that are on the package base substrate 10, and the plurality of memory stacks 300b and the logic semiconductor chip 400 that are on the interposer 50. In some example embodiments, the semiconductor package 3a may include six memory stacks 300b and one logic semiconductor chip 400.

The stiffener structure 504a may include the stiffener film 500FL, a first stiffener extension portion 500ETb, and a second stiffener extension portion 500ETc. The stiffener film 500FL, the first stiffener extension portion 500ETb, and the second stiffener extension portion 500ETc may be integrally formed. The first stiffener extension portion 500ETb may be the same as or substantially similar to the stiffener extension portion 500ET shown in FIGS. 1A and 1C, and the second stiffener extension portion 500ETc may be the same as or substantially similar to the stiffener extension portion 500ETa shown in FIG. 9, and thus detailed descriptions thereof will be omitted. The first stiffener extension portions 500ETb may extend between three memory stacks 300b arranged adjacent to each of the first edge 400S1 and the second edge 400S2 of the logic semiconductor chip 400, and the second stiffener extension portions 500ETc may extend around three memory stacks 300b arranged adjacent to each of the first edge 400S1 and the second edge 400S2 of the logic semiconductor chip 400.

In some example embodiments, the stiffener structure 504a may include the stiffener film 500FL, four first stiffener extension portions 500ETb, and four second stiffener extension portions 500ETc.

Figure 15:
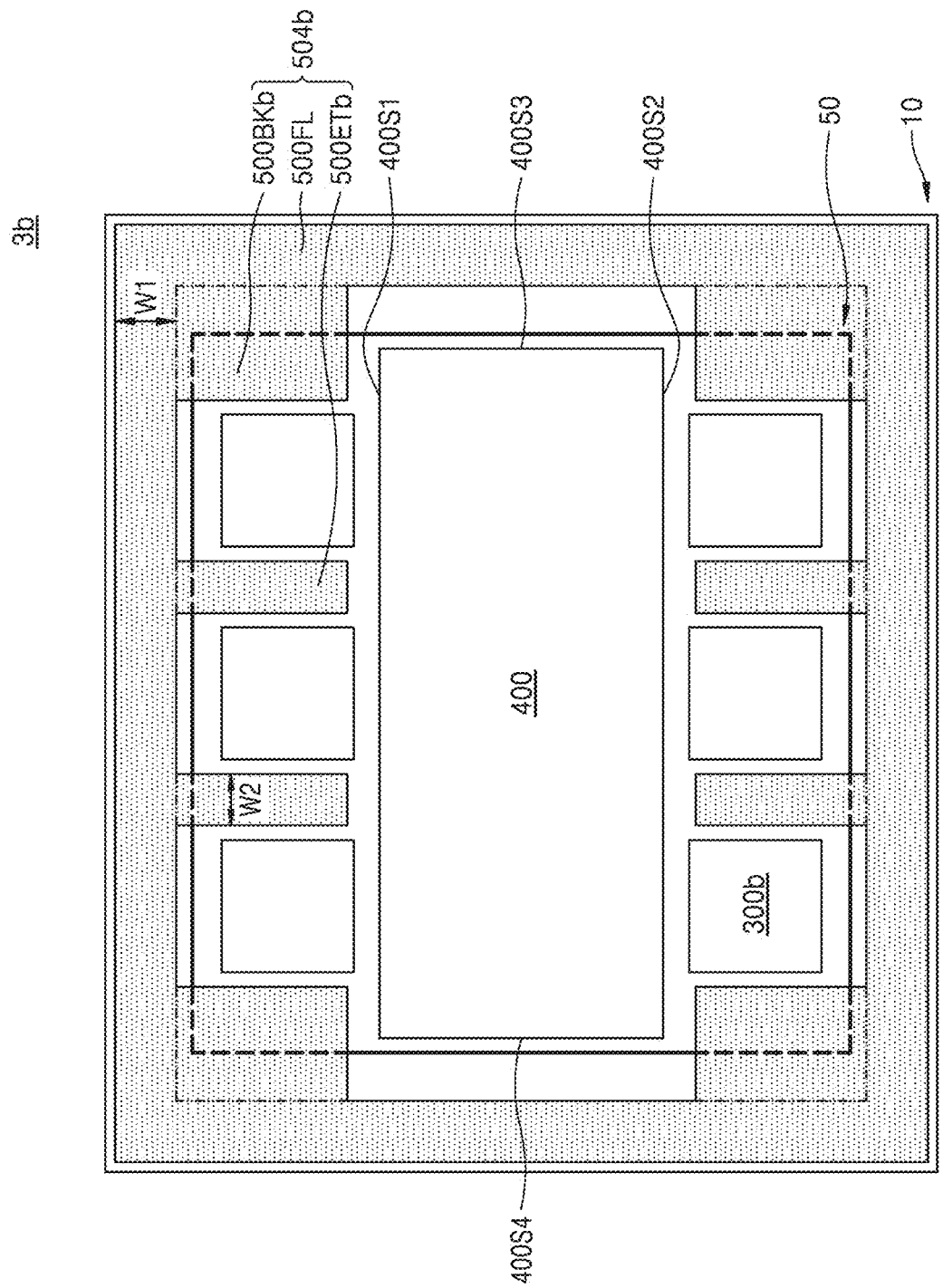

Referring to FIG. 15, the semiconductor package 3b may include the package base substrate 10, the interposer 50 and a stiffener structure 504b that are on the package base substrate 10, and the plurality of memory stacks 300b and the logic semiconductor chip 400 that are on the interposer 50. In some example embodiments, the semiconductor package 3b may include six memory stacks 300b and one logic semiconductor chip 400.

The stiffener structure 504b may include the stiffener film 500FL, the stiffener extension portion 500ETb, and the stiffener block 500BKb. The stiffener film 500FL, the stiffener extension portion 500ETb, and the stiffener block 500BKb may be integrally formed. The stiffener extension portion 500ETb may be the same as or substantially similar to the stiffener extension portion 500ET shown in FIGS. 1A and 1C, and the stiffener block 500BKb may be the same as or substantially similar to the stiffener block 500BKb shown in FIG. 11, and thus detailed descriptions thereof will be omitted. The stiffener extension portions 500ETb may extend between three memory stacks 300b arranged adjacent to each of the first edge 400S1 and the second edge 400S2 of the logic semiconductor chip 400, and the stiffener block 500BKb may be in contact with a portion of two sidewalls connected to each other among the four sidewalls of the stiffener film 500FL and extend onto the interposer 50.

In some example embodiments, the stiffener structure 504b may include the stiffener film 500FL, four stiffener extension portions 500ETb, and four stiffener blocks 500BKb.

Figure 16:
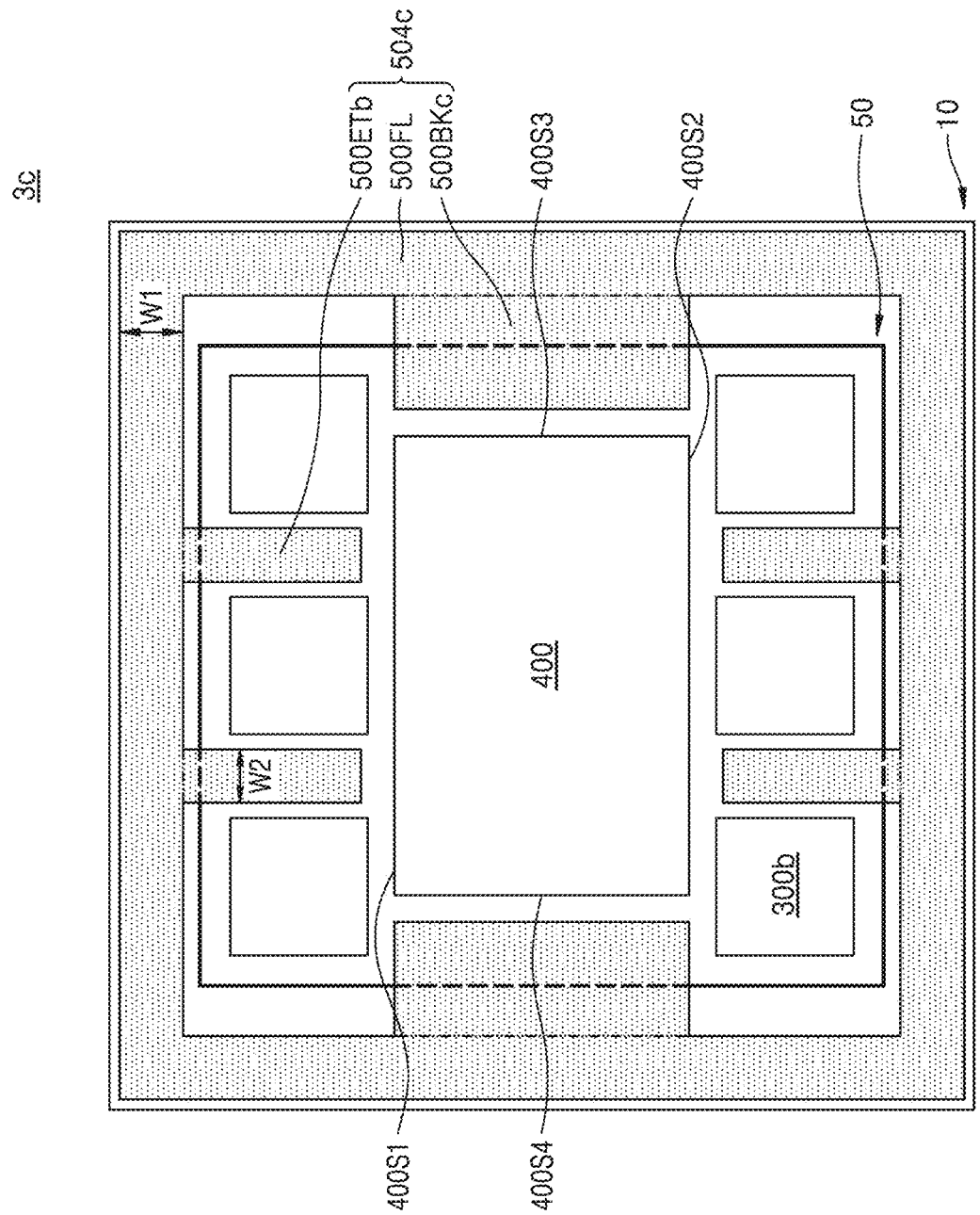

Referring to FIG. 16, the semiconductor package 3c may include the package base substrate 10, the interposer 50 and a stiffener structure 504c that are on the package base substrate 10, and the plurality of memory stacks 300b and the logic semiconductor chip 400 that are on the interposer 50. In some example embodiments, the semiconductor package 3c may include six memory stacks 300b and one logic semiconductor chip 400.

The stiffener structure 504c may include the stiffener film 500FL, the stiffener extension portion 500ETb, and a stiffener block 500BKc. The stiffener film 500FL, the stiffener extension portion 500ETb, and the stiffener block 500BKc may be integrally formed.

The stiffener block 500BKc may extend from each of two sidewalls among the four sidewalls of the stiffener film 500FL toward a corresponding one of the third edge 400S3 and the fourth edge 400S4 of the logic semiconductor chip 400, and may extend onto the interposer 50. In a plan view, the stiffener block 500BKc may be in contact with a portion of one sidewall among the four sidewalls of the stiffener film 500FL.

In some example embodiments, the stiffener structure 504c may include the stiffener film 500FL, four stiffener extension portions 500ETb, and two stiffener blocks 500BKc.

FIGS. 17 to 20 are each a plan layout of a semiconductor package according to some example embodiments of the inventive concepts. In FIGS. 17 to 20, the same reference numerals as those of FIGS. 1A to 16 refer to the same elements, and redundant descriptions thereof are omitted. Semiconductor packages 4, 4a, 4b, and 4c shown in FIGS. 17 to 20 are shown rotated 90 degrees compared to the semiconductor packages 1, 1a, 1b, 1c, 1d, 1e, 1f, 1g, 1h, 1i, 1j, and 2 shown in FIGS. 1A to 12, for convenience of illustration.

Figure 17:
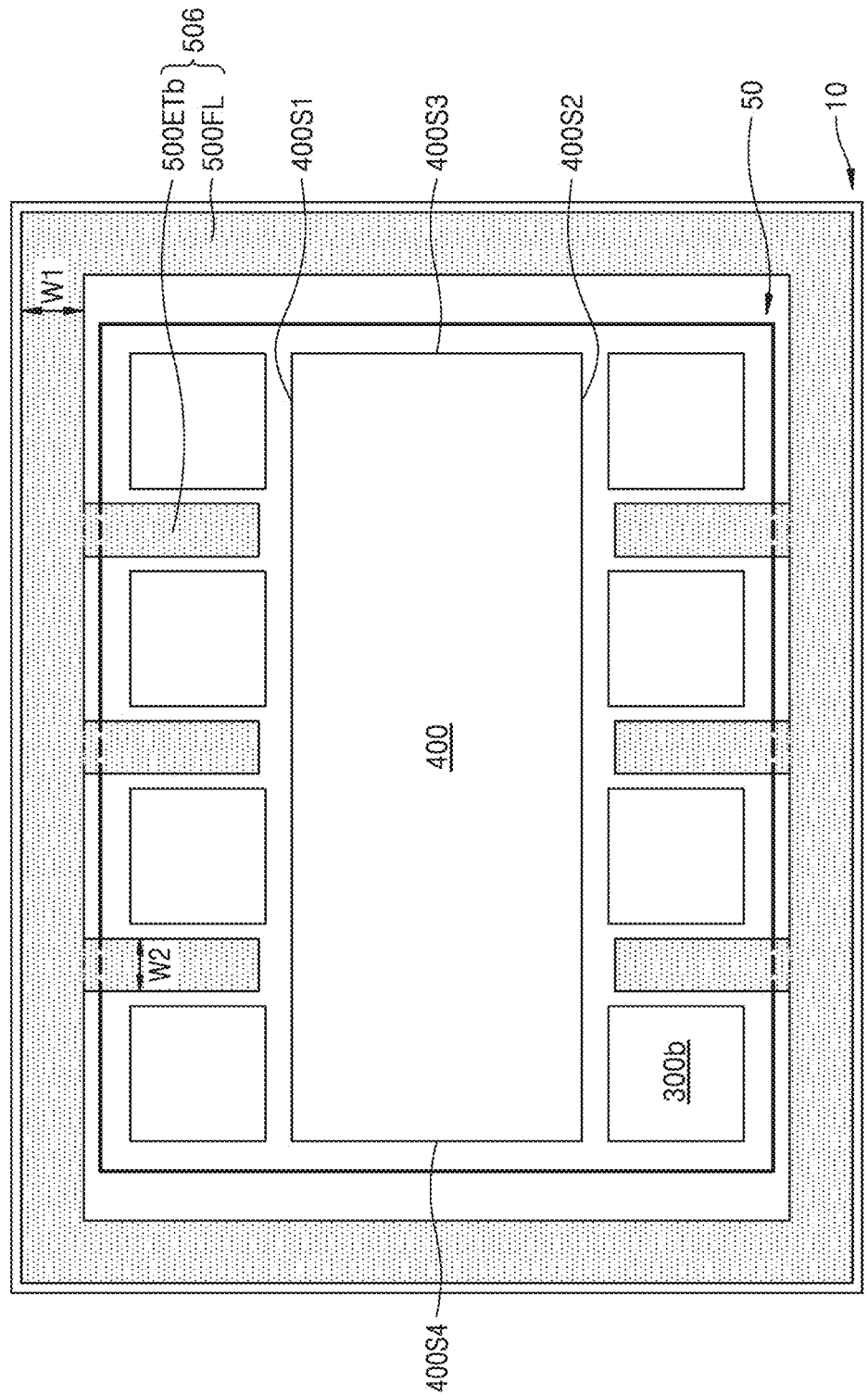
FIGS. 17 to 20 are each a plan layout of a semiconductor package according to some example embodiments of the inventive concepts.

Referring to FIG. 17, the semiconductor package 4 may include the package base substrate 10, the interposer 50 and a stiffener structure 506 that are on the package base substrate 10, the plurality of memory stacks 300b and the logic semiconductor chip 400 that are on the interposer 50.

In some example embodiments, the semiconductor package 4 may include eight memory stacks 300b and one logic semiconductor chip 400. The eight memory stacks 300b may be arranged adjacent to both sides of the logic semiconductor chip 400, that is, four of the eight memory stacks 300b may be arranged adjacent to each of the first edge 400S1 and the second edge 400S2, which are two opposite edges among the four edges of the logic semiconductor chip 400.

The stiffener structure 506 may include the stiffener film 500FL and the stiffener extension portion 500ETb. The stiffener film 500FL may be integrally formed with the stiffener extension portion 500ETb. In some example embodiments, the stiffener structure 506 may include the stiffener film 500FL, and six stiffener extension portions 500ETb extending from the stiffener film 500FL onto the interposer 50.

The stiffener extension portions 500ETb may extend between three memory stacks 300b arranged adjacent to each of the first edge 400S1 and the second edge 400S2 of the logic semiconductor chip 400.

Figure 18:
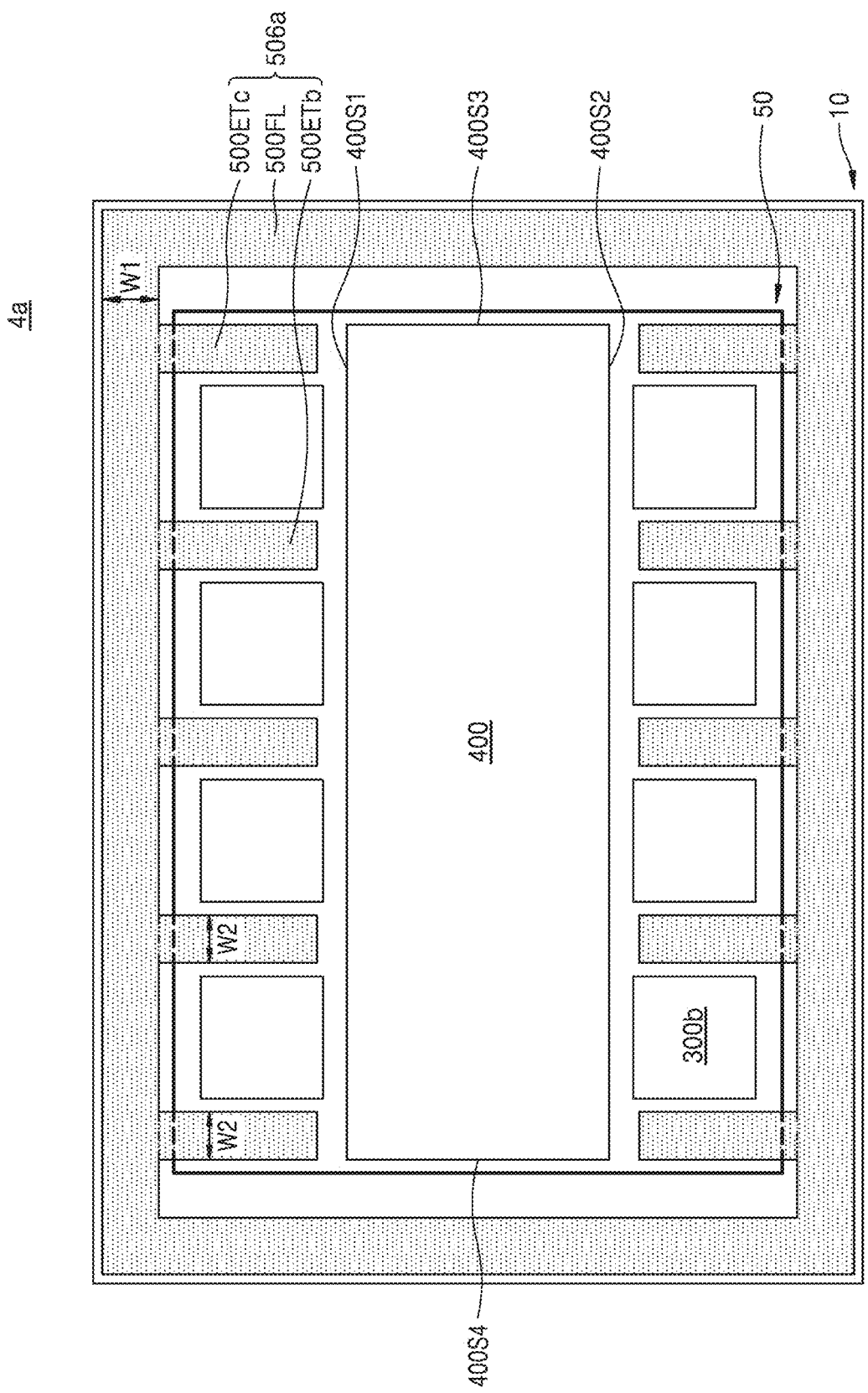

Referring to FIG. 18, the semiconductor package 4a may include the package base substrate 10, the interposer 50 and a stiffener structure 506a that are on the package base substrate 10, the plurality of memory stacks 300b and the logic semiconductor chip 400 that are on the interposer 50.

In some example embodiments, the semiconductor package 4a may include eight memory stacks 300b and one logic semiconductor chip 400.

The stiffener structure 506a may include the stiffener film 500FL, a first stiffener extension portion 500ETb, and a second stiffener extension portion 500ETc. The stiffener film 500FL, the first stiffener extension portion 500ETb, and the second stiffener extension portion 500ETc may be integrally formed. The first stiffener extension portions 500ETb may extend between four memory stacks 300b arranged adjacent to each of the first edge 400S1 and the second edge 400S2 of the logic semiconductor chip 400, and the second stiffener extension portions 500ETc may extend around four memory stacks 300b arranged adjacent to each of the first edge 400S1 and the second edge 400S2 of the logic semiconductor chip 400.

In some example embodiments, the stiffener structure 506a may include the stiffener film 500FL, six first stiffener extension portions 500ETb, and four second stiffener extension portions 500ETc.

Figure 19:
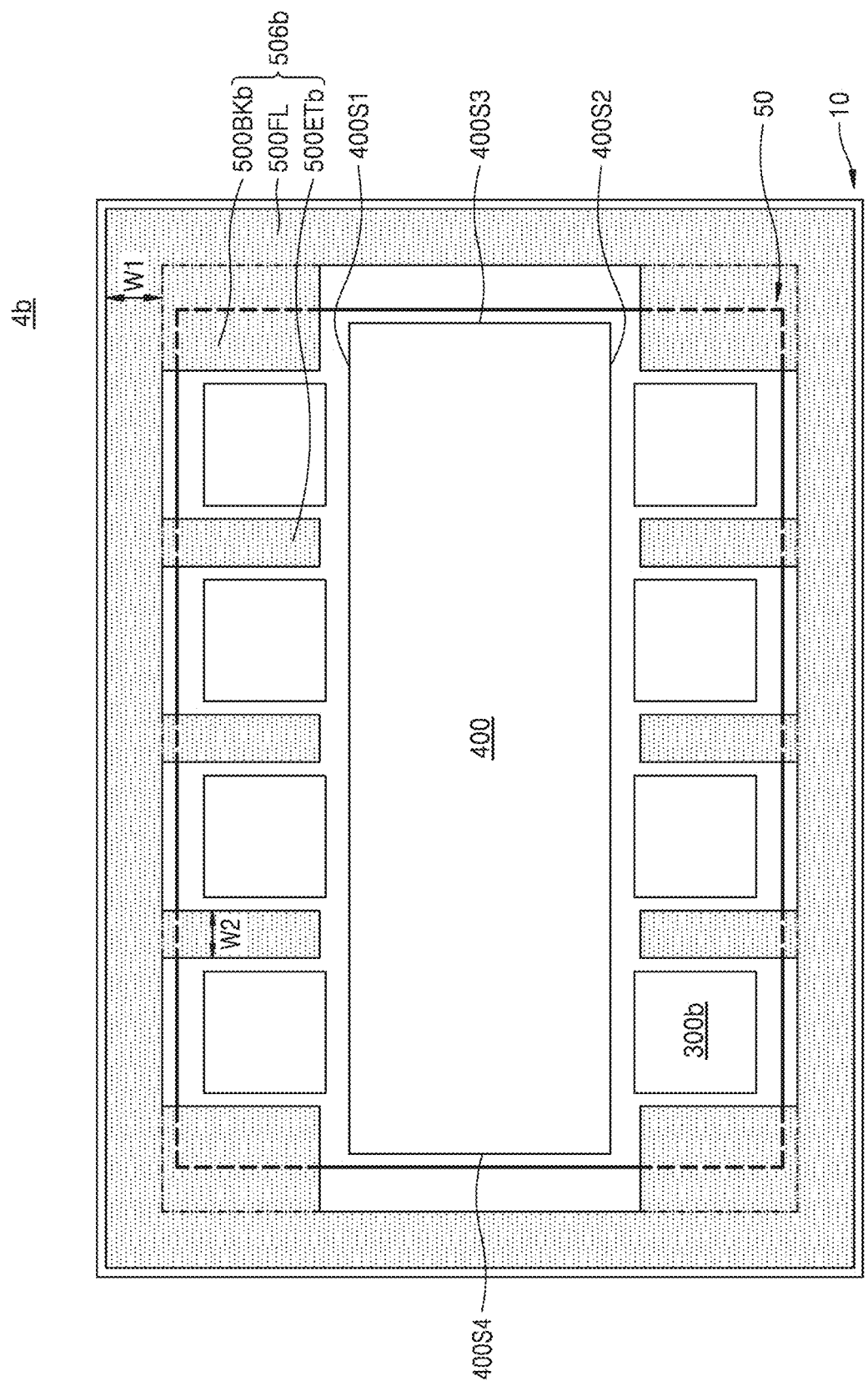

Referring to FIG. 19, the semiconductor package 4b may include the package base substrate 10, the interposer 50 and a stiffener structure 506b that are on the package base substrate 10, and the plurality of memory stacks 300b and the logic semiconductor chip 400 that are on the interposer 50. In some example embodiments, the semiconductor package 4b may include eight memory stacks 300b and one logic semiconductor chip 400.

The stiffener structure 506b may include the stiffener film 500FL, the stiffener extension portion 500ETb, and the stiffener block 500BKb. The stiffener film 500FL, the stiffener extension portion 500ETb, and the stiffener block 500BKb may be integrally formed. The stiffener extension portions 500ETb may extend between four memory stacks 300b arranged adjacent to each of the first edge 400S1 and the second edge 400S2 of the logic semiconductor chip 400, and the stiffener block 500BKb may be in contact with a portion of two sidewalls connected to each other among the four sidewalls of the stiffener film 500FL and extend onto the interposer 50.

In some example embodiments, the stiffener structure 504b may include the stiffener film 500FL, six stiffener extension portions 500ETb, and four stiffener blocks 500BKb.

Figure 20:
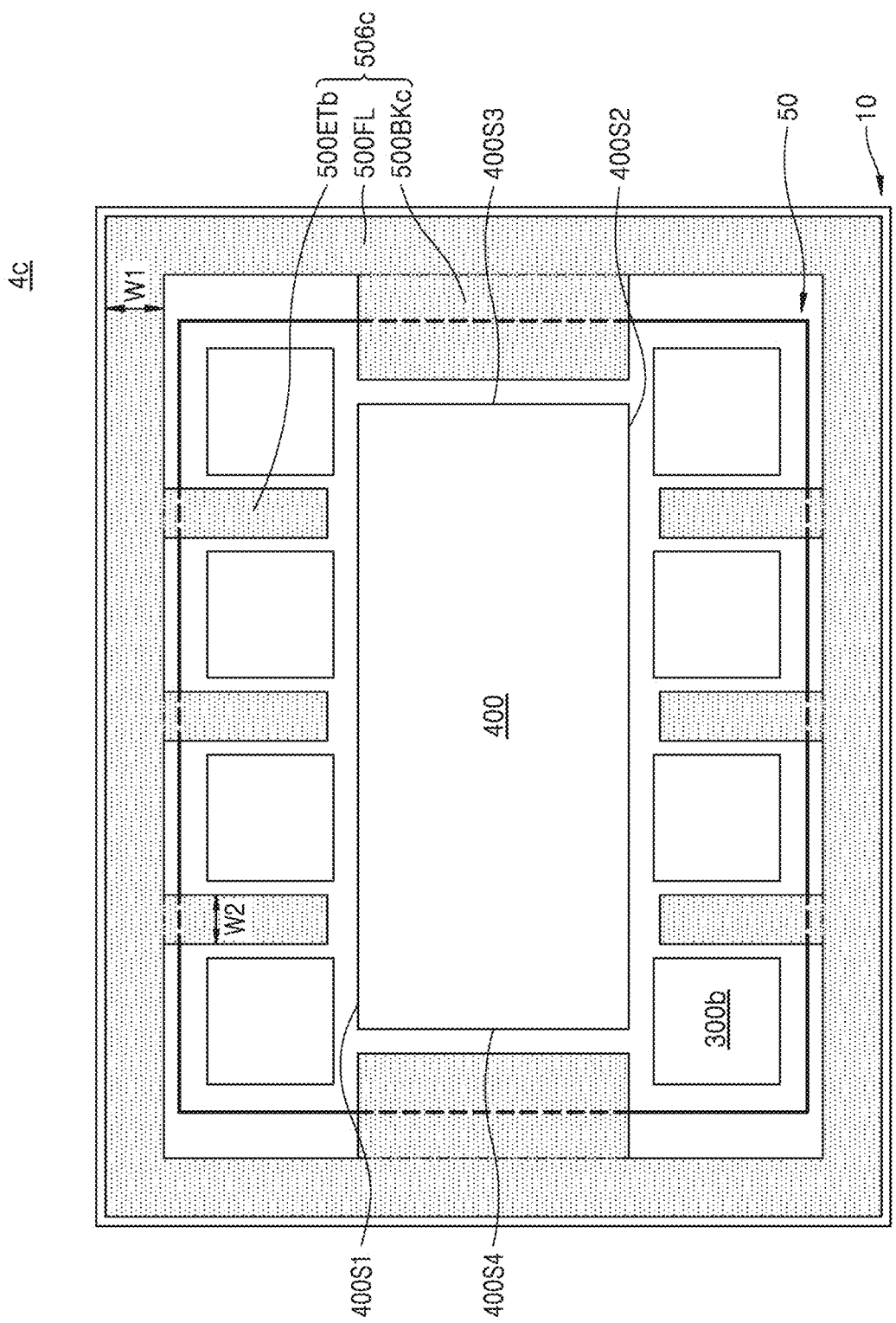

Referring to FIG. 20, the semiconductor package 4c may include the package base substrate 10, the interposer 50 and a stiffener structure 506c that are on the package base substrate 10, the plurality of memory stacks 300b and the logic semiconductor chip 400 that are on the interposer 50. In some example embodiments, the semiconductor package 4c may include eight memory stacks 300b and one logic semiconductor chip 400.

The stiffener structure 506c may include the stiffener film 500FL, the stiffener extension portion 500ETb, and the stiffener block 500BKc. The stiffener film 500FL, the stiffener extension portion 500ETb, and the stiffener block 500BKc may be integrally formed.

The stiffener block 500BKc may extend from each of two sidewalls among the four sidewalls of the stiffener film 500FL toward a corresponding one of the third edge 400S3 and the fourth edge 400S4 of the logic semiconductor chip 400, and may extend onto the interposer 50. In a plan view, the stiffener block 500BKc may be in contact with a portion of one sidewall among the four sidewalls of the stiffener film 500FL.

In some example embodiments, the stiffener structure 506c may include the stiffener film 500FL, six stiffener extension portions 500ETb, and two stiffener blocks 500BKc.

Figure 21:
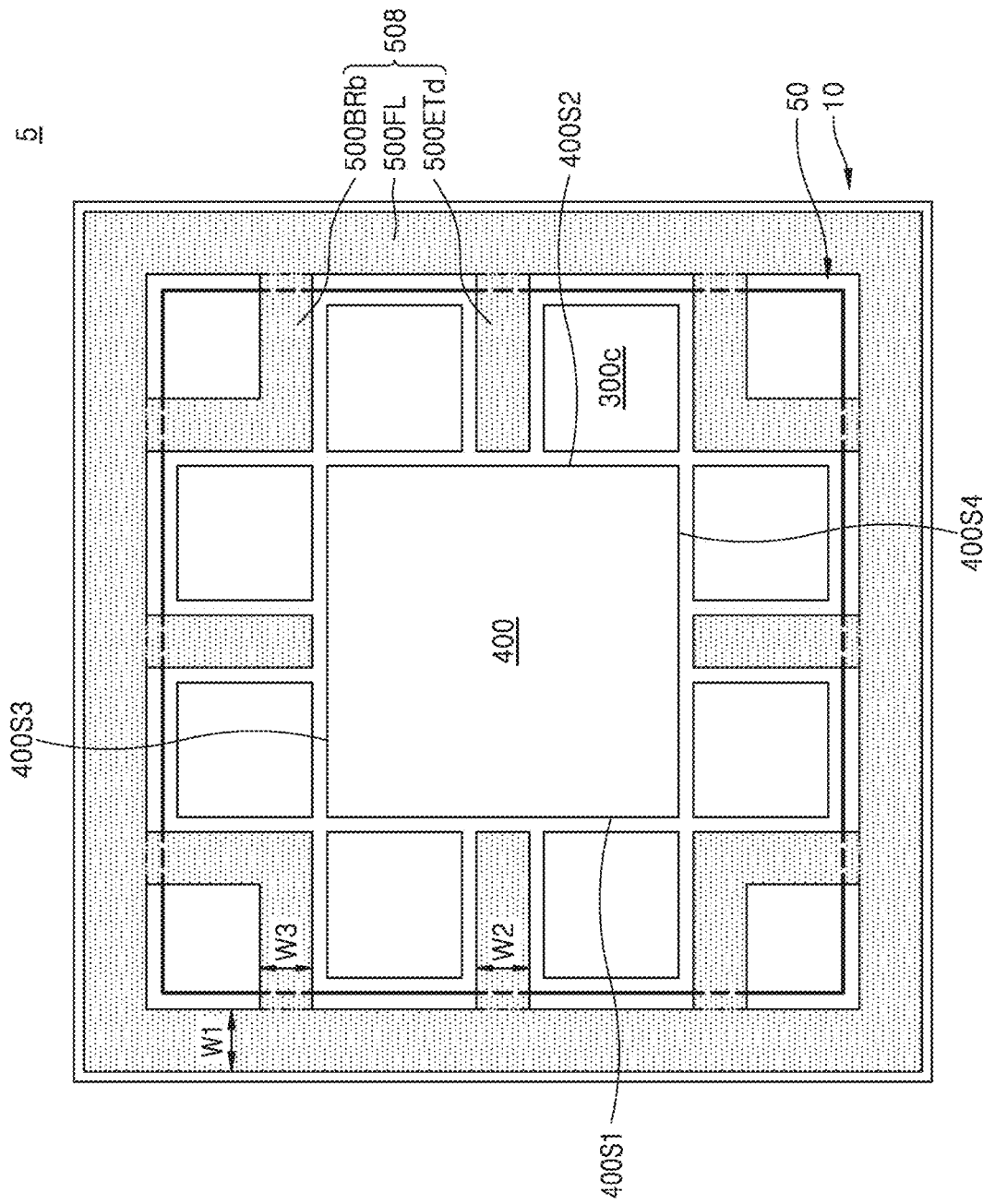

FIGS. 21 to 23 are each a plan layout of a semiconductor package according to some example embodiments of the inventive concepts. In FIGS. 27 to 23, the same reference numerals as those of FIGS. 1A to 20 refer to the same elements, and redundant descriptions thereof are omitted.

Referring to FIG. 21, a semiconductor package 5 may include the package base substrate 10, the interposer 50 and a stiffener structure 508 that are on the package base substrate 10, a plurality of memory stacks 300c and the logic semiconductor chip 400 that are on the interposer 50. In some example embodiments, the semiconductor package 5 may include eight memory stacks 300c and one logic semiconductor chip 400. The eight memory stacks 300c may be arranged adjacent to four edges of the logic semiconductor chip 400, that is, two of the eight memory stacks 300c may be arranged adjacent to each of the first edge 400S1, the second edge 400S2, the third edge 400S3, and the fourth edge 400S4 of the logic semiconductor chip 400. The memory stack 300c may be the same as or substantially similar to the memory stack 300 shown in FIGS. 1A to 11, and thus a detailed description thereof is omitted.

The stiffener structure 508 may include the stiffener film 500FL, a stiffener extension portion 500ETd, and a stiffener bridge 500BRb. The stiffener film 500FL, the stiffener extension portion 500ETd, and the stiffener bridge 500BRb may be integrally formed. Some of the stiffener extension portions 500ETd extending toward the first edge 400S1 or the second edge 400S2 of the logic semiconductor chip 400 may be the same as or substantially similar to the stiffener extension portion 500ET shown in FIGS. 1A and 1C, and some other of the stiffener extension portions 500ETd extending toward the third edge 400S3 or the fourth edge 400S4 of the logic semiconductor chip 400 may be the same as or substantially similar to the stiffener extension portion 500ETa of FIG. 9, and thus detailed descriptions thereof will be omitted.

The stiffener bridge 500BRb may extend from a portion of the stiffener film 500FL to other portion of the stiffener film 500FL via (e.g., over) the interposer 50, and may be apart from the package base substrate 10. The stiffener bridge 500BRb may extend between two sidewalls connected to each other among the four sidewalls of the stiffener film 500FL, and may be bent on a portion adjacent to the edge of the interposer 50. For example, the stiffener bridge 500BRb may have an L-shape. The interposer thermal interface material layer 564 as shown in FIGS. 1B to 1D may be on a portion of a lower surface of each of stiffener bridges 500BRb, and the stiffener bridge 500BRb may be on the interposer 50 with the interposer thermal interface material layer 564 therebetween. Further, the stiffener bridge 500BRb may overlap the ground pad 52G as shown in FIGS. 1B to 1D in the vertical direction.

The stiffener bridge 500BRb may include two stiffener extension portions connected to each other and extending from each of two sidewalls, which are in contact with each other among the four sidewalls of the stiffener film 500FL, onto the interposer 50. That is, one stiffener bridge 500BRb may include two stiffener extension portions extending in directions orthogonal to each other. In some example embodiments, one stiffener bridge 500BRb may be a stiffener extension portion extending from one sidewall of the stiffener film 500FL onto the interposer 50 and further extending to other one sidewall connected to the one side.

In some example embodiments, the stiffener structure 508 may include the stiffener film 500FL, four stiffener extension portions 500ETd, and four stiffener bridges 500BRb.

Referring to FIG. 22, a semiconductor package 5a may include the package base substrate 10, the interposer 50 and a stiffener structure 508a that are on the package base substrate 10, a plurality of memory stacks 300c and the logic semiconductor chip 400 that are on the interposer 50. In some example embodiments, the semiconductor package 5a may include eight memory stacks 300c and one logic semiconductor chip 400.

The stiffener structure 508b may include the stiffener film 500FL, the stiffener extension portion 500ETd, and the stiffener block 500BKb. The stiffener film 500FL, the stiffener extension portion 500ETd, and the stiffener block 500BKb may be integrally formed. The stiffener block 500BKb may be the same or substantially similar to the stiffener block 500BKb shown in FIG. 11, and thus a detailed description thereof is omitted.

In some example embodiments, the stiffener structure 508a may include the stiffener film 500FL, four stiffener extension portions 500ETd, and four stiffener blocks 500BKb.

Referring to FIG. 23, a semiconductor package 5b may include the package base substrate 10, the interposer 50 and a stiffener structure 508b that are on the package base substrate 10, a plurality of memory stacks 300c and the logic semiconductor chip 400 that are on the interposer 50. In some example embodiments, the semiconductor package 5b may include eight memory stacks 300c and one logic semiconductor chip 400. The eight memory stacks 300c may surround the logic semiconductor chip 400. For example, the eight memory stacks 300c may be sequentially arranged along four consecutive edges of the logic semiconductor chip 400 (e.g., the first edge 400S1, the fourth edge 400S4, the second edge 400S2, and the third edge 400S3).

The stiffener structure 508b may include the stiffener film 500FL and the stiffener extension portion 500ETd. The stiffener film 500FL may be integrally formed with the stiffener extension portion 500ETd. In some example embodiments, the stiffener structure 508b may include the stiffener film 500FL and four stiffener extension portions 500ETd, but the inventive concepts are not limited thereto. In some other example embodiments, the stiffener structure 508b may include the stiffener film 500FL and eight stiffener extension portions 500ETd arranged between the eight memory stacks 300c sequentially arranged along the four consecutive edges of the logic semiconductor chip 400.

Figure 24A:
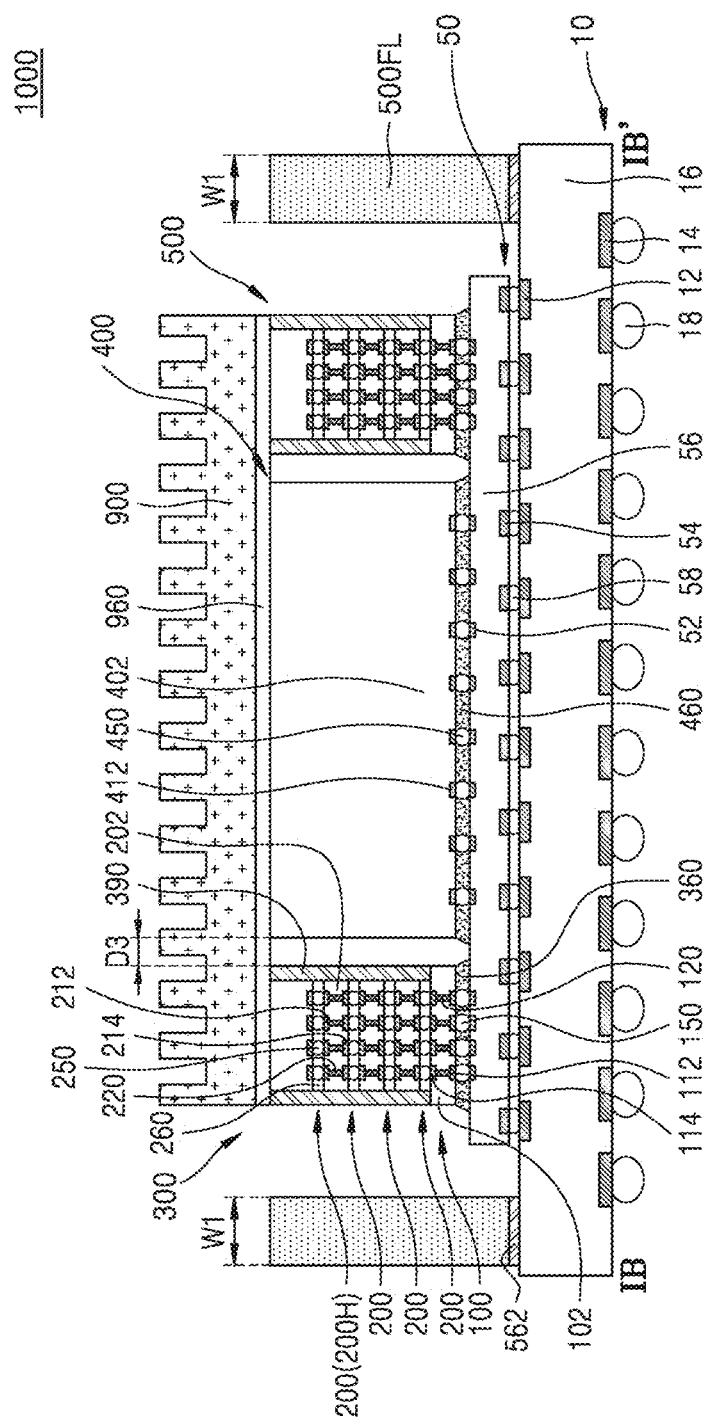
FIGS. 24A and 24B are each a cross-sectional view of a semiconductor package according to some example embodiments of the inventive concepts.
Figure 24B:
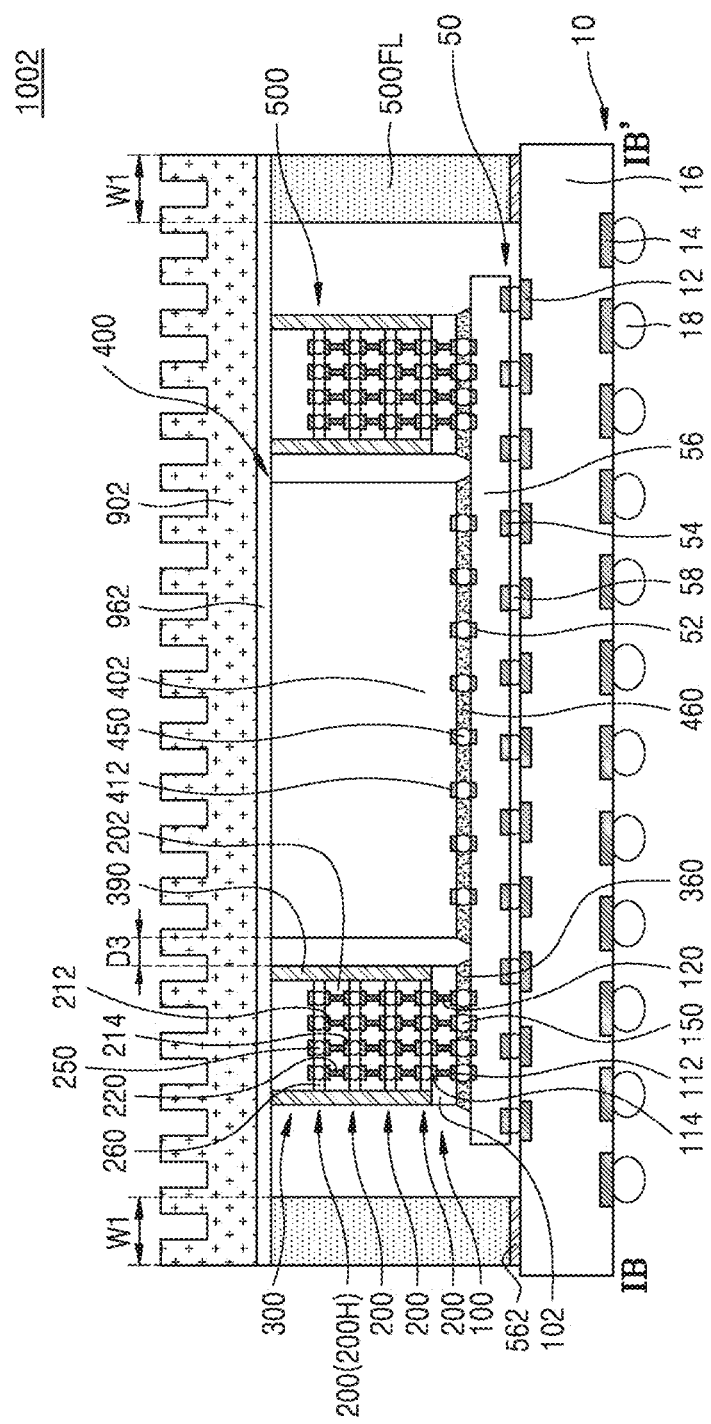

FIGS. 24A and 24B are each a cross-sectional view of a semiconductor package according to some example embodiments of the inventive concepts.

Referring to FIG. 24A, a semiconductor package 1000 may further include a heat radiation member 900 on the semiconductor package 1 shown in FIGS. 1A to 1D. The heat radiation member 900 may be on the plurality of memory stacks 300 and the logic semiconductor chip 400 with a thermal interface material layer 960 therebetween. The heat radiation member 900 may be, for example, a heat sink, a heat spreader, a heat pipe, or a liquid cooled cold plate.

In some example embodiments, the heat radiation member 900 may overlap the interposer 50 in a vertical direction, but may not overlap the stiffener film 500FL in the vertical direction.

Referring to FIG. 24B, a semiconductor package 1002 may further include a heat radiation member 902 on the semiconductor package 1 shown in FIGS. 1A to 1D. The heat radiation member 902 may be on the plurality of memory stacks 300, the logic semiconductor chip 400, and the stiffener structure 500 with a thermal interface material layer 962 therebetween.

In some example embodiments, the heat radiation member 902 may overlap the interposer 50 and the stiffener film 500FL in the vertical direction.

Although the semiconductor packages 1000 and 1002 are illustrated as including the semiconductor package 1 shown in FIGS. 1A to 1D in FIGS. 24A and 24B, the inventive concepts are not limited thereto. For example, the semiconductor packages 1000 and 1002 shown in FIGS. 24A and 24B may include the semiconductor packages 1*a*, 1*b*, 1*c*, 1*d*, 1*e*, 1*f*, 1*g*, 1*h*, 1*i*, 1*j*, 2, 3, 3*a*, 3*b*, 3*c*, 4, 4*a*, 4*b*, 4*c*, 5, 5*a*, and 5*b* shown in FIGS. 2 to 23 instead of the semiconductor package 1 shown in FIGS. 1A to 1D.

While the inventive concepts has been particularly shown and described with reference to some example embodiments thereof, it will be understood that various changes in form and details may be made therein without departing from the spirit and scope of the following claims.

What is claimed is:

1. A semiconductor package comprising:
   a package base substrate;
   an interposer on the package base substrate;
   a plurality of semiconductor chips on the interposer, the plurality of semiconductor chips including a plurality of memory stacks; and
   a stiffener structure comprising a stiffener frame and a stiffener extension portion, wherein
   the stiffener frame is on the package base substrate and apart from the interposer, the stiffener frame surrounding the plurality of semiconductor chips,
   the stiffener extension portion horizontally extends from the stiffener frame, is spaced apart from the plurality of semiconductor chips, extends onto the interposer to have a portion on the interposer, and extends between an adjacent pair of the plurality of memory stacks, and
   the stiffener frame is an integral structure with the stiffener extension portion.

2. The semiconductor package of claim 1, wherein the stiffener frame is attached to the package base substrate with a substrate thermal interface material layer therebetween such that the substrate thermal interface material layer covers a lower surface of the stiffener frame, and
   the stiffener extension portion is attached to the interposer with an interposer thermal interface material layer therebetween such that the interposer thermal interface material layer covers a portion of a lower surface of the stiffener extension portion.

3. The semiconductor package of claim 1, wherein
   a lower surface of the stiffener extension portion is at a higher vertical level than an upper surface of the interposer, and
   a lower surface of the stiffener frame is at a lower vertical level than the lower surface of the stiffener extension portion.

4. The semiconductor package of claim 1, wherein an upper surface of the stiffener frame and an upper surface of the stiffener extension portion are at a same vertical level.

5. The semiconductor package of claim 1, wherein the plurality of semiconductor chips comprise:
   a plurality of memory stacks each comprising a first semiconductor chip and a plurality of second semiconductor chips, the plurality of memory stacks each spaced apart from each other in a horizontal direction, the plurality of second semiconductor chips being sequentially stacked on the first semiconductor chip in a vertical direction; and
   a logic semiconductor chip spaced apart from the plurality of memory stacks in the horizontal direction.

6. The semiconductor package of claim 5, wherein
   the plurality of memory stacks comprise two memory stacks, and
   the stiffener extension portion extends between the two memory stacks adjacent to an edge of the logic semiconductor chip.

7. The semiconductor package of claim 5, wherein
   the plurality of memory stacks comprise at least one memory stack, and
   the stiffener extension portion extends toward the logic semiconductor chip and extends along a side of the at least one memory stack adjacent to an edge of the logic semiconductor chip.

8. The semiconductor package of claim 5, wherein the stiffener extension portion extends from one sidewall of the stiffener frame to another sidewall of the stiffener frame through the interposer.

9. The semiconductor package of claim 1, wherein a first separation distance between the stiffener frame and an edge of the interposer is greater than a second separation distance between the stiffener frame and an edge of the package base substrate.

10. The semiconductor package of claim 1, wherein the stiffener frame has a first width and extends along an edge of the package base substrate, and the stiffener extension portion has a second width equal to or less than the first width and extends from the stiffener frame onto the interposer.

11. A semiconductor package comprising:
    a package base substrate;
    an interposer on the package base substrate;
    a plurality of memory stacks and a logic semiconductor chip on the interposer, the plurality of memory stacks and the logic semiconductor chip spaced apart from each other in a horizontal direction; and
    a stiffener structure comprising a stiffener frame and a stiffener extension portion, wherein
    the stiffener frame has a rectangular ring shape surrounding the interposer in a plan view, extends along an edge of the package base substrate on the package base substrate, and is apart from the interposer, and
    the stiffener extension portion has a bar shape in a plan view and extends from the stiffener frame onto the interposer and is apart from the plurality of memory stacks and the logic semiconductor chip, wherein
    at least two of the plurality of memory stacks are adjacent to each of a first edge and a second edge of the logic semiconductor chip, the first edge and the second edge being opposite to each other,
    the stiffener structure comprises two stiffener extension portions, and
    each of the two stiffener extension portions extends between the at least two of the plurality of memory stacks adjacent to a corresponding one of the first edge and the second edge of the logic semiconductor chip.

12. The semiconductor package of claim 11, wherein
    an upper surface of the stiffener frame and an upper surface of the stiffener extension portion are at a same vertical level, and
    a vertical height of the stiffener frame is greater than a vertical height of the stiffener extension portion.

13. The semiconductor package of claim 11, wherein the stiffener frame is attached to the package base substrate with a substrate thermal interface material layer therebetween such that the substrate thermal interface material layer entirely covers a lower surface of the stiffener frame, and the stiffener extension portion is attached to the interposer with an interposer thermal interface material layer therebetween such that the interposer thermal interface material layer covers a portion of a lower surface of the stiffener extension portion.

14. The semiconductor package of claim 13, wherein
the package base substrate comprises a base board layer, and a plurality of first upper surface pads and a plurality of first lower surface pads, the plurality of first upper surface pads and the plurality of first lower surface pads being on an upper surface and a lower surface of the base board layer, respectively, and the substrate thermal interface material layer is in contact with the base board layer and is not in contact with the plurality of first upper surface pads.

15. The semiconductor package of claim 13, wherein
the interposer comprises a base layer, and a plurality of second upper surface pads and a plurality of second lower surface pads, the plurality of second upper surface pads and the plurality of second lower surface pads being on an upper surface and a lower surface of the base layer respectively, the plurality of second upper surface pads comprise a ground pad, and the interposer thermal interface material layer is in contact with the ground pad.

16. The semiconductor package of claim 11, wherein the stiffener extension portion extends between the plurality of memory stacks, and does not extend between each of the plurality of memory stacks and the logic semiconductor chip.

17. A semiconductor package comprising:
a package base substrate;
an interposer spaced apart from an edge of the package base substrate in a plan view and attached to an inside of the package base substrate;
a logic semiconductor chip on the interposer;
a plurality of memory stacks spaced apart from the logic semiconductor chip and on the interposer, each of the plurality of memory stacks comprising a first semiconductor chip and a plurality of second semiconductor chips sequentially stacked on the first semiconductor chip in a vertical direction, at least two of the plurality of memory stacks being adjacent to a first edge and a second edge of the logic semiconductor chip and being apart from each other, the first edge and the second edge being opposite to each other; and a stiffener structure comprising a stiffener frame and a stiffener extension portion, wherein the stiffener frame has a rectangular ring shape surrounding the interposer in a plan view, extends along the edge of the package base substrate, is apart from the interposer, and is on the package base substrate with a substrate thermal interface material layer therebetween, the substrate thermal interface material layer covering a lower surface of the stiffener frame, and the stiffener extension portion is an integral structure with the stiffener frame, the stiffener extension portion horizontally extending from the stiffener frame to between the at least two of the plurality of memory stacks, having a bar shape in a plan view, and being on the interposer with an interposer thermal interface material layer therebetween, the interposer thermal interface material layer covering a portion of a lower surface of the stiffener extension portion.

18. The semiconductor package of claim 17, wherein
upper surfaces of the plurality of memory stacks and an upper surface of the logic semiconductor chip are at a same vertical level, and an upper surface of the stiffener structure is at a same vertical level as the upper surfaces of the plurality of memory stacks and the upper surface of the logic semiconductor chip or at a vertical level 10 μm to 50 μm lower than the upper surfaces of the plurality of memory stacks and the upper surface of the logic semiconductor chip.

19. The semiconductor package of claim 17, wherein
the stiffener frame has a thickness of about 500 μm to about 800 μm and a width of about 1 mm to about 3 mm, and extends along the edge of the package base substrate, and the stiffener extension portion has a thickness of about 300 μm to about 700 μm and a width of about 100 μm to about 2 mm, and is separated from a corresponding one of the plurality of memory stacks by a separation distance of about 20 μm to about 100 μm.

* * * * *